United States Patent [19]

Oritsuki et al.

[11] Patent Number: 5,032,536
[45] Date of Patent: Jul. 16, 1991

[54] METHOD FOR MANUFACTURING A LIQUID CRYSTAL DISPLAY DEVICE WITH THIN-FILM-TRANSISTORS

[75] Inventors: Ryouji Oritsuki, Shirako; Masateru Wakui; Hirofumi Suzuki, both of Mobara, all of Japan

[73] Assignee: Hitachi, Ltd., Tokyo, Japan

[21] Appl. No.: 322,982

[22] Filed: Mar. 14, 1989

[30] Foreign Application Priority Data

Mar. 16, 1988 [JP] Japan .................. 63-60361

[51] Int. Cl.⁵ .......................... H01L 21/306
[52] U.S. Cl. ..................... 437/51; 437/181; 437/41; 437/909; 437/228; 156/652; 156/656; 156/657; 357/4; 357/23.7
[58] Field of Search .............. 437/181, 41, 909, 51, 437/58, 228; 357/23.7, 4; 156/652, 656, 657

[56] References Cited

U.S. PATENT DOCUMENTS

| | | | |
|---|---|---|---|
| 4,558,340 | 12/1985 | Schachter et al. | 357/23.7 |
| 4,651,185 | 3/1987 | Holmberg et al. | 357/23.7 |
| 4,778,560 | 10/1988 | Takeda et al. | 357/23.7 |
| 4,933,296 | 6/1990 | Parks et al. | 437/181 |

Primary Examiner—Brian E. Hearn
Assistant Examiner—Tuan Nguyen
Attorney, Agent, or Firm—Antonelli, Terry, Stout & Kraus

[57] ABSTRACT

There is disclosed a liquid crystal color display of the active matrix type. A method of fabricating the display is initiated by depositing a transparent conductive material of indium tin oxide (ITO) as a thin layer onto a glass plate. Then chromium is deposited as an opaque film onto the ITO layer. The two layers are selectively removed, using a first mask pattern. A layer of an insulator consisting of $Si_3N_4$ is deposited on the laminate within a reducing atmosphere of plasma. An I-type amorphous silicon layer is formed on the insulator layer. A highly doped N-type amorphous silicon layer is then formed. The N-type silicon layer, the I-type silicon layer, and the silicon nitride layer are selectively removed. An aluminum layer is formed on the laminate and then selectively etched away. Finally, the chromium layer is selectively etched away to form gates, gate leads, pixel electrodes, sources, drains and drain leads.

13 Claims, 16 Drawing Sheets

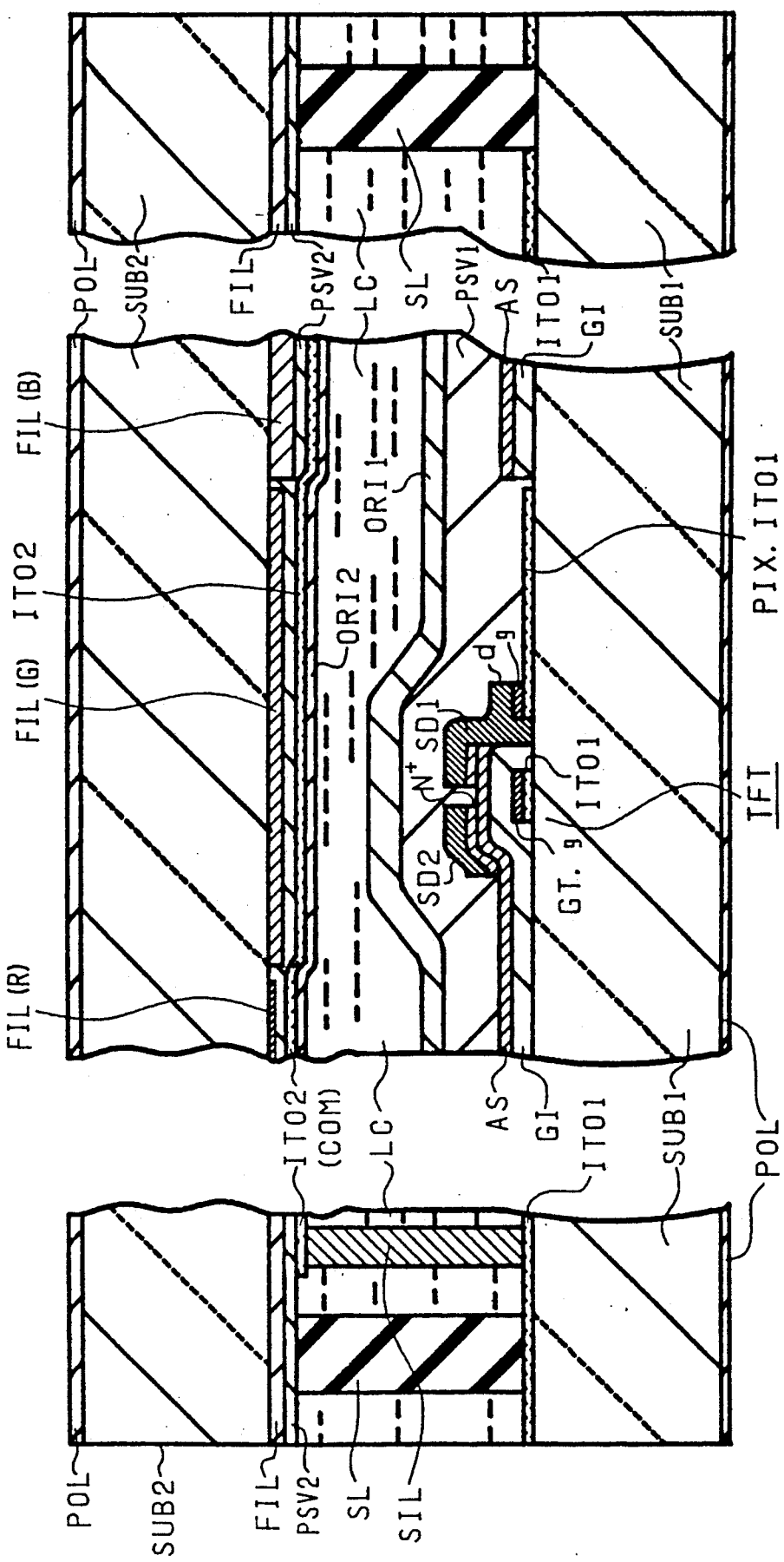

METHOD FOR MANUFACTURING A LIQUID CRYSTAL DISPLAY DEVICE WITH THIN-FILM-TRANSISTORS

FIELD OF THE INVENTION

The present invention relates to techniques effectively applied to methods of forming thin films and active matrix displays, especially a liquid crystal display of the active matrix type each pixel of which comprises a thin-film transistor and a pixel electrode.

BACKGROUND OF THE INVENTION

A liquid crystal display of the active matrix type has a character display portion in which a number of pixels are arranged in rows and columns. Each pixel is disposed in a region surrounded by two neighboring scanning signal lines, or gate signal lines, and two video signal lines, or drain signal lines, which intersect the scanning lines. A plurality of scanning signal lines extend horizontally to form rows. A plurality of video signal lines extend vertically and cross the scanning signal lines to form columns.

The aforementioned pixel consists essentially of a liquid crystal, a transparent pixel electrode, a common transparent electrode disposed on the opposite side of the pixel electrode from the liquid crystal, and a thin-film transistor. Individual pixels have their respective transparent pixel electrodes and their respective thin-film transistors. The pixel electrode of each pixel is connected with one electrode (hereinafter referred to as the source for convenience) of the thin-film transistor. The other electrode (referred to as the drain) of the thin-film transistor is connected with one of the video signal lines. Gates are connected with the scanning signal lines.

Liquid crystal television displays of the active matrix type which have been recently commercialized require a number of steps to fabricate thin-film transistors on a glass plate. This means that 7 to 12 photographic masks are needed. This series of manufacturing steps accounts for a large proportion of the whole manufacturing cost. Different masking levels are often subjected to different photographic processes and, therefore, the rate of opening, i.e., brightness, is frequently sacrificed to give allowance to mask alignment.

In the active matrix type, DC component tends to be applied to the liquid crystal because of electrostatic coupling between scanning signals. Reduction in the DC component will contribute to increase in the life of the liquid crystal and also prevent nonuniformity of displayed image.

Usually, unwanted incident light to the front surface of a liquid crystal display is blocked by a film formed on thin-film transistors, while unwanted back light is intercepted by opaque gates. The present inventors et al. made various experiments and have found that gates of normal size cannot sufficiently block light. This tendency becomes especially conspicuous in projector-type displays using strong light sources.

When light falls on the amorphous semiconductor layer of a thin-film transistor, pairs of electrons and positive holes are created. This deteriorates the cutoff characteristics of the transistor. For this reason, the device is required to be designed so that the amount of light hitting this layer is reduced to a minimum. To make characters visible, natural light or artificial light emitted by an indoor electric lamp is caused to enter the device from the front surface of the device, or light emitted from a fluorescent lamp or the like is made to enter the device from the rear surface of the device.

As the above-described liquid crystal displays are fabricated in larger sizes, the sizes of the pixels tend to increase. As an example, the dimensions of pixels in the character display portions of liquid crystal displays fabricated in the past were 0.2 mm×0.2 mm. The present inventors have developed a liquid crystal display having pixels measuring 0.32 mm×0.32 mm.

During manufacture of liquid crystal displays of this kind, foreign matter such as dust may be introduced into the character display portion. Also, foreign matter may adhere to masks used in photolithography. If foreign matter is introduced between the source (or transparent pixel electrode) of a thin-film transistor and the drain or exists between them, a short circuit occurs between them. Then the short-circuited pixel malfunctions, producing a point defect. If similar foreign matter is introduced between the source (or a transparent pixel electrode) of a thin-film transistor and the gate or exists between them, a point defect is formed in the same way. Therefore, the present inventors have discovered the fact that as the size of each pixel increases, such point defects or loss of pixels in the liquid crystal display becomes more conspicuous.

A device in which the size of gate electrodes is made larger than the semiconductor layer is known as disclosed in Japanese Patent Laid-Open No. 17,962/1985. However, simply increasing the size of gate electrodes will increase the parasitic capacitance between gate and source, which in turn increases the DC component to an intolerable level, the DC component being applied to the liquid crystal in response to a scanning signal. In total this demerit is too large. Hence, it is difficult to put the device into practical use.

SUMMARY OF THE INVENTION

It is an object of the invention to provide a liquid crystal display which can be manufactured economically.

It is another object of the invention to provide a liquid crystal display which exhibits high brightness.

It is a further object of the invention to provide a long-lived liquid crystal display.

It is a still other object of the invention to provide a liquid crystal display having thin-film transistors whose cutoff characteristics are less deteriorated when light falls upon the transistors.

It is a yet other object of the invention to provide a liquid crystal display which have thin-film transistors possessing improved cutoff characteristics, and in which DC component applied to the liquid crystal is suppressed.

It is still another object of the invention to provide a method of fabricating a liquid crystal display in such a way that point defects in the character display portion, or defective pixels, are reduced.

It is yet another object of the invention to provide a method of fabricating a liquid crystal display in such a manner that point defects formed in the character display portion are made less conspicuous.

It is an additional object of the invention to provide a method of fabricating a liquid crystal display in such a way that point defects in the character display portion, or defective pixels, are reduced and that nonuniformity of the brightness of darkened portions is reduced.

It is a still additional object of the invention to provide a method of fabricating a liquid crystal display easily in such a manner that nonuniformity of the brightness of darkened portions is reduced.

It is a yet additional object of the invention to provide a method of fabricating a liquid crystal display in which the DC component applied to the liquid crystal of the character display portion is reduced, and in which nonuniformity of the brightness of darkened portions is reduced.

In one embodiment of the invention, two layers, i.e., a transparent conductive layer and an opaque conductive layer, are first patterned to form gates, leads, and pixel electrodes. Then a gate-insulating film, sources, drains, and leads are formed. Using these, the opaque conductive layer on the pixel electrodes is selectively removed.

In one feature of the invention, masks and photographic steps used only to pattern pixel electrodes are omitted.

The above and other objects and features of the invention will be apparent from a reading of the following description taken in connection with the accompanying drawings wherein like numerals refer to like parts.

BRIEF DESCRIPTION OF THE DRAWINGS

FIG. 2A is a cross-sectional view taken on line 2A—2A of FIG. 1, also showing a portion surrounding a seal portion;

DETAILED DESCRIPTION OF THE INVENTION

Figure 1:
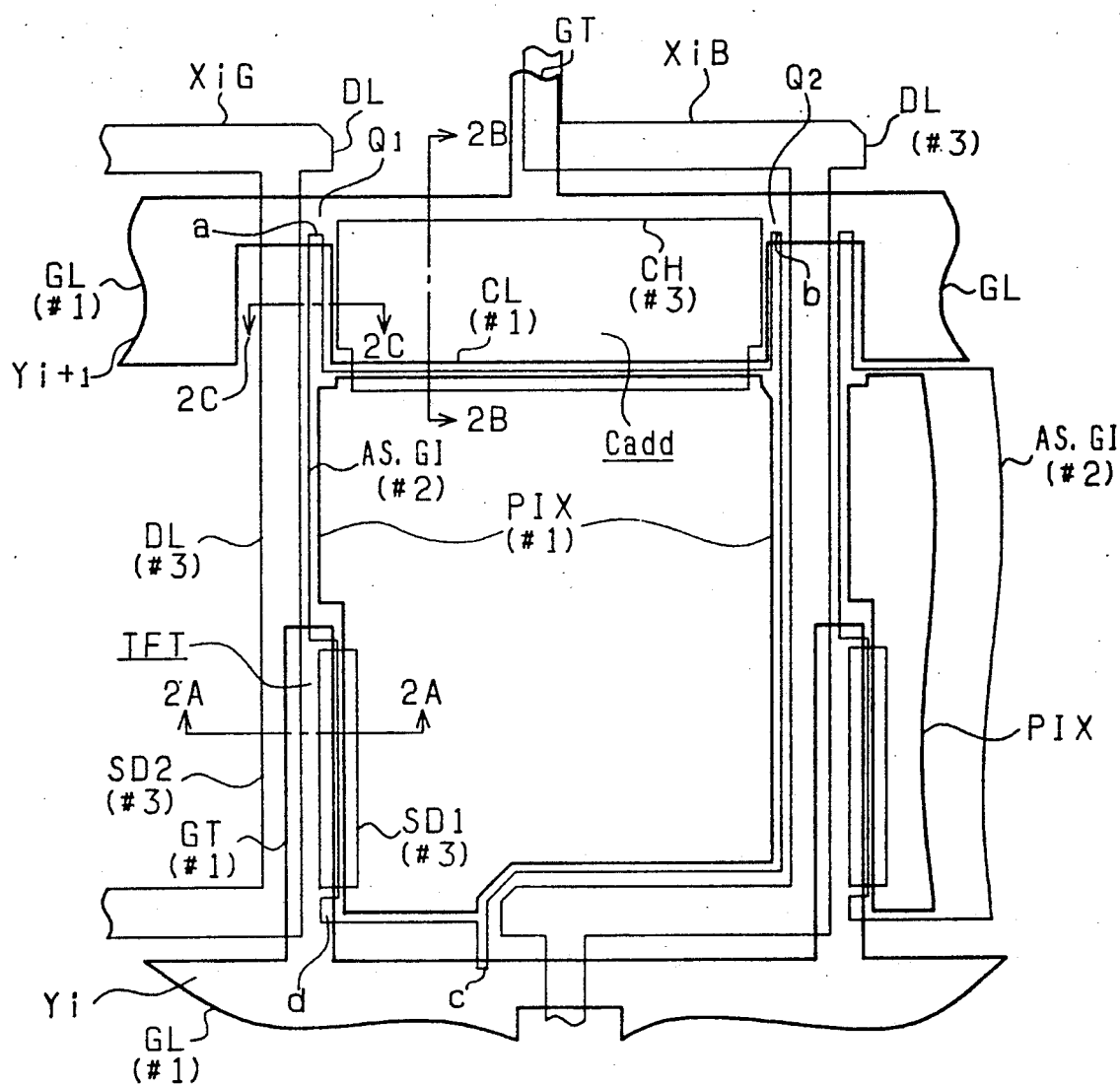
FIG. 1 is a plan view of main portions of one pixel of the active matrix type liquid crystal color display according to the invention.
Figure 2B:
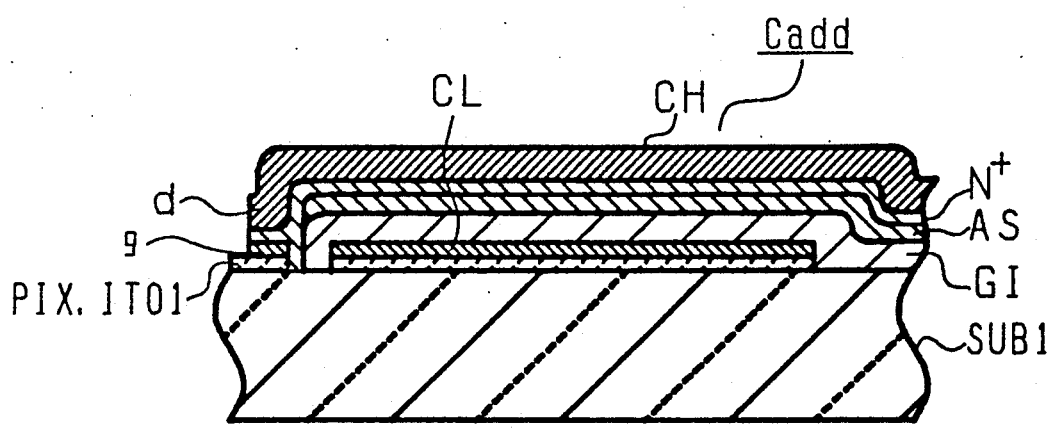
FIGS. 2B and 2C are cross-sectional views taken on lines 2B—2B and 2C—2C, respectively, of FIG. 1.
Figure 2C:
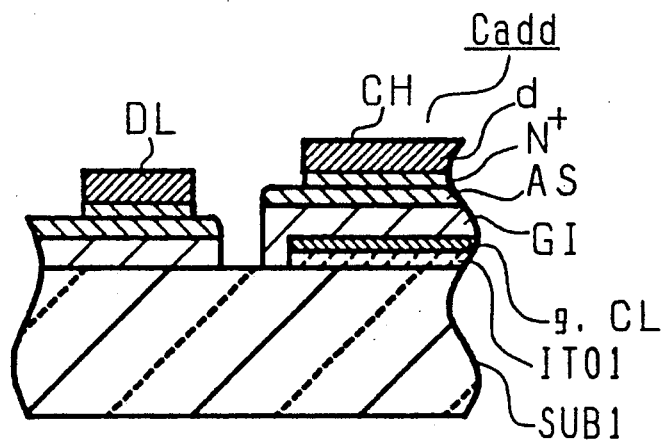
Figure 3:
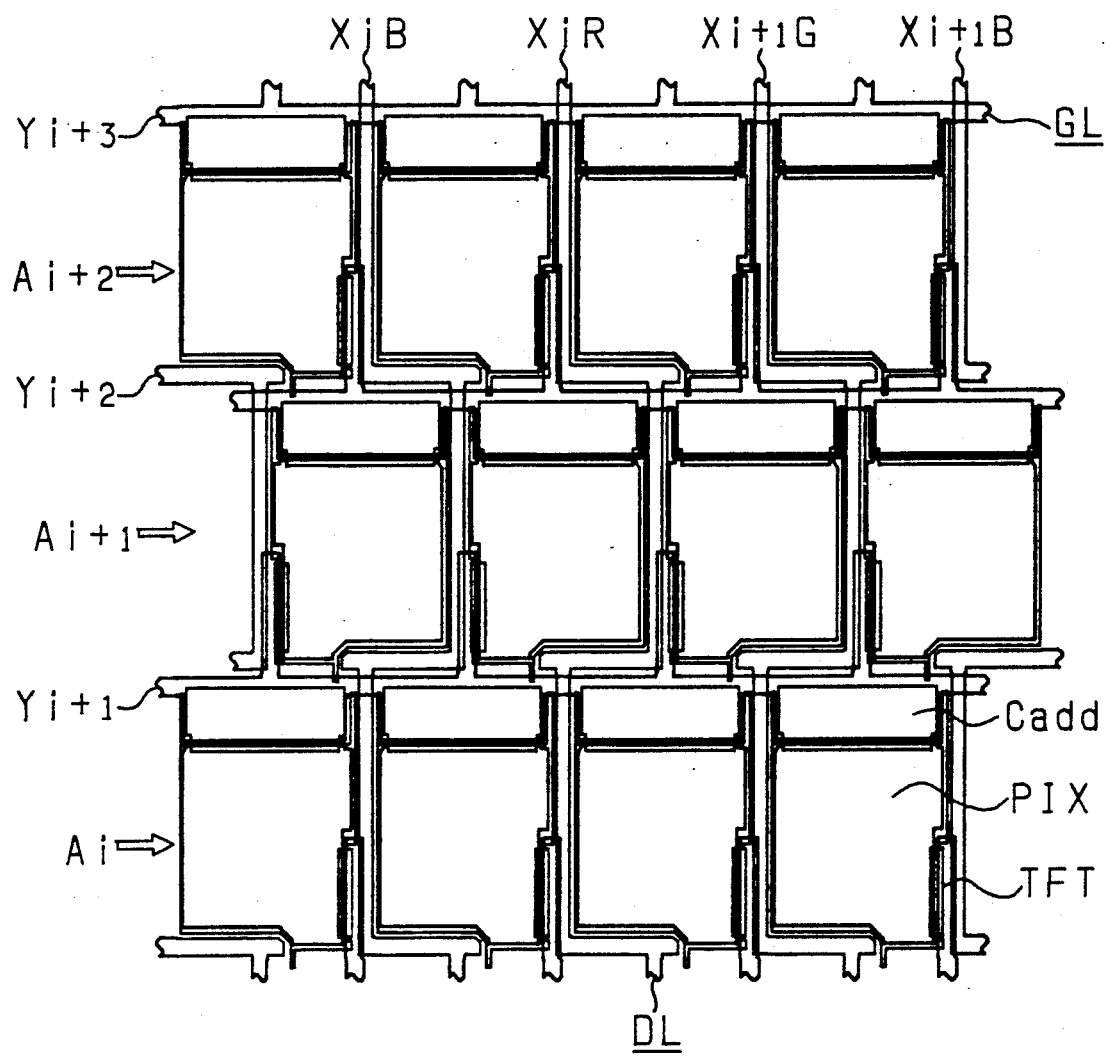
FIG. 3 is a plan view of main portions of the liquid crystal display shown in FIG. 1, and in which the pixel shown in FIG. 1 and similar pixels are arranged.

Referring to FIGS. 1-3, there is shown an active matrix type liquid crystal color display embodying the concept of the invention. This display has a lower transparent plate SUB1 made of glass. A liquid crystal LC is enclosed inside the lower glass plate SUB1. Pixels, or picture elements, comprising thin-film transistors TFT and transparent pixel electrodes PIX are formed on the inner surface of the lower plate SUB1, which is about 1.1 mm thick, for example.

Each pixel is disposed in a region surrounded by two neighboring scanning signal lines GL and two neighboring video signal lines DL. The scanning signal lines GL extend horizontally and are also called horizontal signal lines. The video signal lines DL run vertically and are also called drain signal lines or vertical signal lines. As shown in FIGS. 1 and 3, a plurality of scanning signal lines GL extend horizontally, while a plurality of video signal lines DL extend vertically. Thus, the pixels are arranged in rows and columns.

Each thin-film transistor TFT consists essentially of a gate GT, an insulation film GI, an intrinsic, or I-type, amorphous silicon semiconductor layer AS, a source SD1, and a drain SD2. The I-type semiconductor layer AS is not doped with any impurity which determines the conduction type. During operation of the network of the present liquid crystal display, the polarities of the biases applied to the source SD1 and the drain SD2 are inverted and, therefore, the roles of the source and the drain are interchanged during the operation. In the description made below, however, the electrodes SD1 and SD2 are always referred to as the source and the drain, respectively, for convenience.

In the plan view of FIG. 1, the aforementioned gate GT is located at a lower left position. A similar gate is shown to be placed at a lower right position. Each gate protrudes from the scanning signal line GL upwardly as viewed in FIG. 1 and takes a prolonged U-shaped form. That is, the gate GL extends substantially parallel to the video signal line DL. The gate GT is continuous with the scanning signal line GL and protrudes into the region in which the transistor TFT is formed.

The source SD1 and the drain SD2 are in non-rectifying contact with the I-type silicon layer AS via a heavily doped N-type silcon layer $N^+$. The gate-insulating film GI extends below the source SD1 and the drain SD2. The gate GT is located below the gap between the source SD1 and the drain SD2, and underlies the gate-insulating film GI.

The two parallel portions of the scanning signal line GL are spaced more from each other between the two neighboring video signal lines DL. In FIG. 1, one portion bows downward to form one electrode, or lower electrode CL, of a capacitor $C_{add}$. The other electrode of the capacitor $C_{add}$ is located at a higher position and formed by an electrode, or upper electrode CH, which is formed by a layer flush with the source SD1 and the drain SD2. As can be seen from the cross-sectional structure shown in FIG. 2B, the capacitor $C_{add}$ comprises the upper electrode CH and the lower electrode CL and an insulator sandwiched between them, the insulator consisting of the insulation film GI and the I-type silicon layer AS. The heavily doped silicon layer $N^+$ acts as an electrode plate of the capacitor and so the upper electrode CH and the silicon layer $N^+$ will be hereinafter collectively referred to as the upper electrode CH. The insulating laminate of the film GI and the silicon layer AS is so patterned that it terminates at the left end of the figure. This permits the upper electrode CH to make an ohmic contact with a pixel electrode PIX. Thus, the capacitor $C_{add}$ is formed between the pixel electrode PIX and the neighboring upper scanning line GL, the electrode PIX being connected with the transistor TFT driven by some lower scanning line GL. The capacitor $C_{add}$ acts to reduce the parasitic capacitance between the gate GT and the source SD1 and to decrease electrostatic noise caused by changes in scanning pulses applied to the scanning lines GL. The capacitor also serves to prolong the time for which video information is retained after the transistor TFT is biased off. It substantially follows that the capacitor $C_{add}$ is connected in parallel with the capacitance of the liquid crystal formed by the liquid crystal layer LC and electrodes PIX and ITO2 placed on the opposite sides of the layer LC, as long as alternating current is concerned. Thus, it can be said that the capacitor $C_{add}$ is an auxiliary capacitor.

The whole structure of the liquid crystal is shown in FIG. 2A. A protective film PSV1 is formed over the thin-film transistor TFT and the transparent pixel electrode PIX mainly to protect the transistor TFT from moisture. The protective film is designed so that it shows high transparency and high resistance to moisture As an example, the protective film PSV1 is a film of silicon oxide or silicon nitride formed by plasma-assisted CVD and has a thickness of about 8000 Å.

The thin-film transistor TFT is so designed that when a positive bias is applied to the gate GT, the channel resistance between the source and the drain decreases and that when the bias is reduced down to zero, the channel resistance increases.

A lower orientation film ORI1 and an upper orientation film ORI2 are formed between the lower transparent glass plate SUB1 and the upper transparent glass plate SUB2 to set the orientation of the molecules of the liquid crystal LC that is sealed between the films ORI1 and ORI2. The lower film ORI1 is formed on the protective film PSV1 which is on the side of the lower glass plate SUB1. Color filters FIL, a protective film PSV2, a common transparent electrode ITO2, and the upper orientation film ORI2 are stacked in this order on the inner surface of the upper transparent glass plate 2 which is on the side of the liquid crystal LC.

The common transparent electrode ITO2 is opposite and common to all the transparent pixel electrodes PIX of the pixels which are formed on the side of the lower transparent glass plate SUB1. A common voltage $V_{com}$ which is between a low energizing voltage $V_{dmin}$ and a high energizing voltage $V_{dmax}$ applied to the video signal lines DL is applied to the common electrode ITO2.

Each color filter FIL is formed by dyeing a base material such as acrylic resin with a dyestuff. Each filter FIL is disposed opposite to one pixel and dyed one of three colors. Each color filter FIL is formed in a region surrounded by two neighboring scanning signal lines GL and two neighboring video signal lines DL in the same way as the pixels.

The color filters FIL can be formed in the manner described now. First, a base material such as gelatin is applied to the surface of the upper transparent glass plate SUB2. Then, the base material is removed by photolithography from regions other than regions where red filters are formed. Subsequently, the remaining base material is dyed with a red dyestuff, which is then fixed to form red filters FIL(R). Similarly, green filters FIL(G) and blue filters FIL(B) are successively formed.

In this way, the filters FIL of these colors are formed in the regions defined by the signal lines, in an opposite relation to the pixels. Since the scanning signal lines GL and the video signal lines DL exist between the various color filters FIL, allowance corresponding to the presence of the signal lines is afforded in aligning the pixels with the color filters FIL. Further, when the various color filters are formed, allowance is given in aligning filters of one color with filters of the other colors.

The protective film PSV2 is formed to prevent the dyestuff included in the color filters FIL from leaking into the liquid crystal LC. This film PSV2 is made from a transparent resin such as acrylic resin or epoxy resin.

In assemblying this liquid crystal display, the layers on the side of the lower transparent glass plate SUB1 and the layers on the side of the upper transparent glass plate SUB2 are first separately formed. Then, the upper plate SUB1 is placed above the lower plate SUB2. Finally, the liquid crystal LC is inserted between these two plates.

As shown in FIG. 3, the aforementioned pixels form rows $A_i$, $A_{i+1}$, $A_{i+2}$, etc., each row extending parallel to the scanning signal lines GL ($Y_i$). In every pixel forming the rows $A_i$, $A_{i+1}$, $A_{i+2}$, etc., one thin-film transistor TFT and one transparent pixel electrode PIX are disposed at their respective fixed positions. In particular, in each pixel forming rows $A_{i+1}$, $A_{i+3}$ (not shown), etc., one thin-film transistor TFT is located at the left, and one transparent pixel electrode PIX is positioned at the right. The configuration of the pixels of the rows $A_i$, $A_{i+2}$, etc. adjacent to the rows $A_{i+1}$, $A_{i+3}$, etc. and the configuration of the pixels of the rows $A_{i+1}$, $A_{i+3}$, etc. are symmetrical with respect to the video signal lines DL. Specifically, in each pixel forming the rows $A_i$, $A_{i+2}$, etc., one thin-film transistor TFT is located at the right, and one transparent pixel electrode PIX is situated at the left. The pixels of the rows $A_i$, $A_{i+2}$, etc. are shifted horizontally from the pixels of the rows $A_{i+1}$, $A_{i+3}$, etc. by a distance equal to half the distance between successive pixels. We now assume that the successive pixels of the row $A_i$ are spaced from each other by a distance of 1.0. The successive pixels of the following row $A_{i+1}$ are spaced from each other also by a distance of 1.0 and shifted horizontally from the pixels of the preceding row $A_i$ by a distance of 0.5. The video signal lines DL ($X_i$) extending vertically between successive pixels extend horizontally a distance of 0.5 between the adjacent rows of pixels.

In this way, in the character display portion, each pixel row is formed by horizontally disposing pixels of the same structure, i.e., the thin-film transistors TFT and the transparent pixel electrodes ITO are disposed in their respective fixed positions in the pixels. The configuration of the pixels of one row and the configuration of the pixels of the next row are symmetrical with respect to the intervening video signal line DL. The pixels of one row are shifted from the pixels of the preceding row by a distance equal to half the distance between successive pixels. Thus, as can be seen from FIG. 4 in which the color filters are placed on the pixels, the pixels of one row bearing filters of a given color, e.g., the pixels of the row $A_i$ having red filters R, can be shifted from the pixels of the next row of the same color, e.g., the pixels of the row $A_{i+1}$ having red filters R, by a distance of 1.5. That is, the pixels of one row are always spaced from the pixels of the nearest row having filters of the same color by a distance 1.5 times as long as the distance between successive pixels. The three proximate red, green, and blue filters form a triangular arrangement which improves mixing of the colors. This can enhance the resolution at which color images are displayed.

Since the video signal lines DL extend only a distance equal to the distance between successive pixels between the neighboring rows of pixels, the lines DL do not intersect the adjacent lines DL. Therefore, the video signal lines DL are prevented from drawing complex figures. This can lead to a reduction in the area of the space occupied by the lines DL. Also, the video signal lines DL are prevented from bypassing other lines. Hence, a multilayer wiring structure can be avoided.

Figure 5:
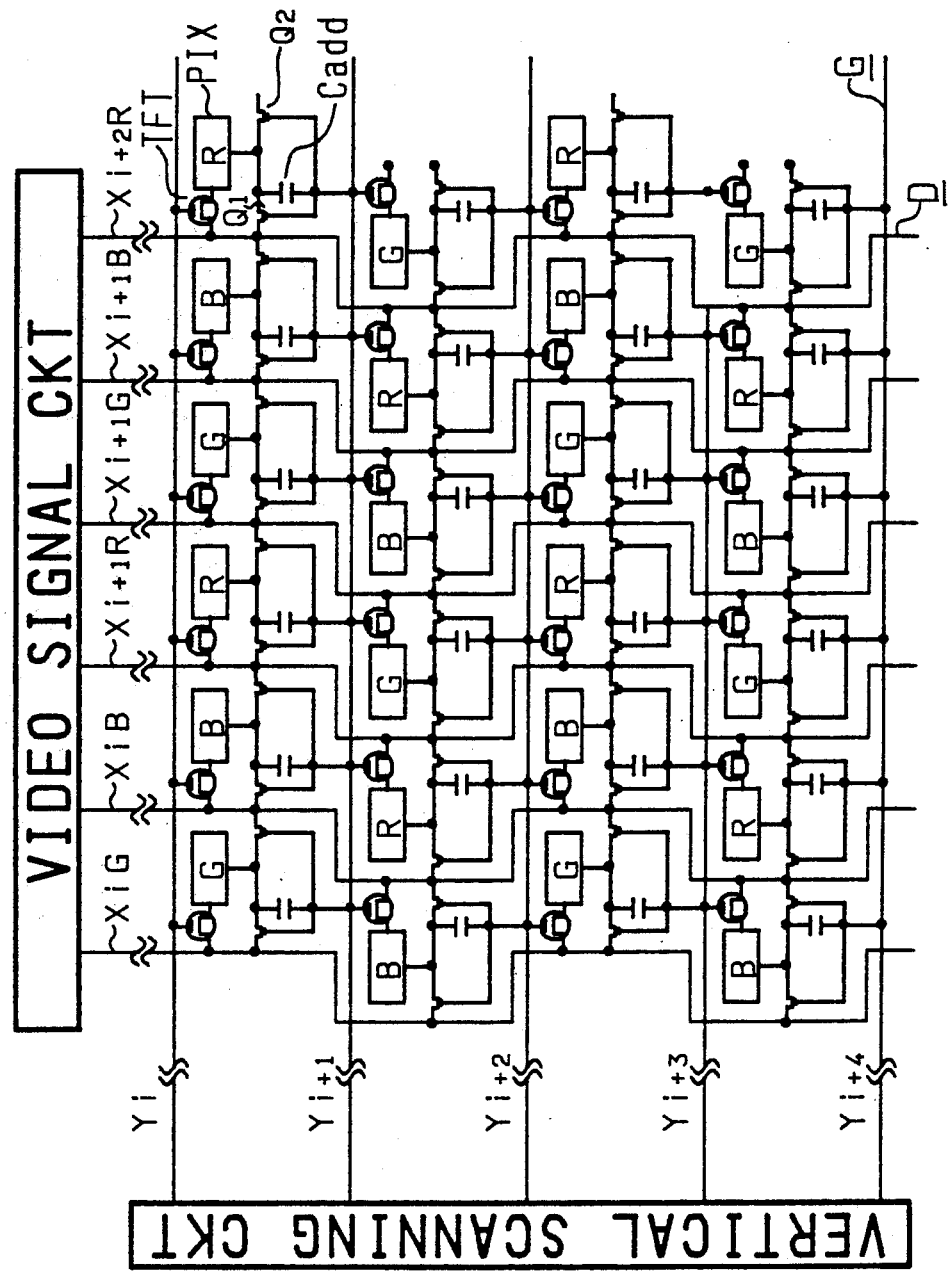
FIG. 5 is an equivalent circuit diagram of the liquid crystal display shown in FIGS. 1-4.
Figure 7:
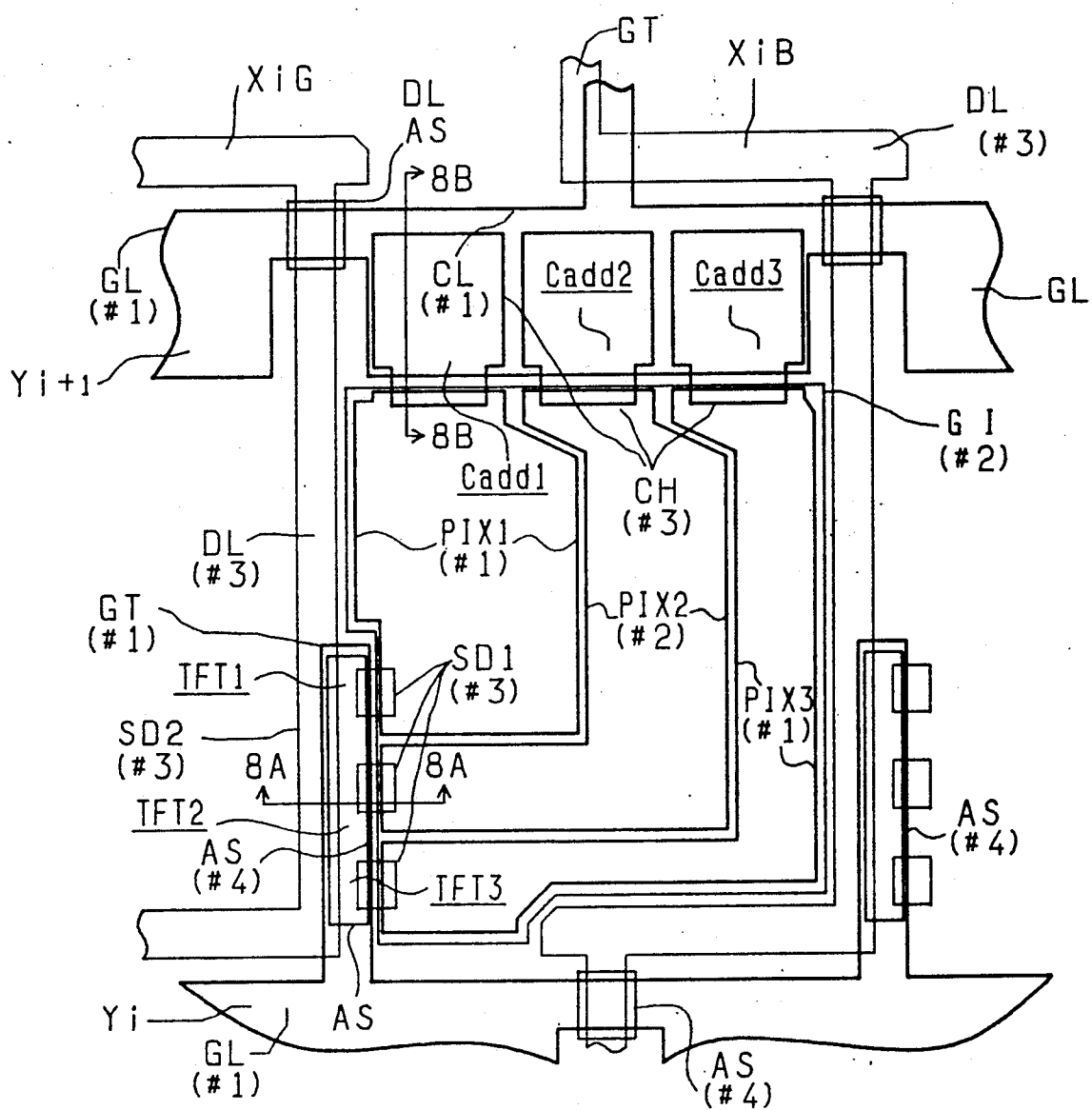
FIG. 7 is a plan view of main portions of one pixel of another active matrix type liquid crystal color display according to the invention.

An equivalent circuit of this liquid crystal display is shown in FIG. 5, where $X_iG$, $X_{i+1}G$, etc. are video signal lines DL connected with the pixels on which green filters G are formed. The video signal lines DL connected with the pixels having blue filters B are indicated by $X_iB$, $X_{i+1}B$, etc. The video signal lines DL connected with the pixels having red filters R are denoted by $X_{i+1}R$, $X_{i+2}R$, etc. These video signal lines DL are selectively energized by a video signal driving circuit. The scanning signal line GL which selects the pixel row $A_i$ shown in FIGS. 3 and 7 is indicated by $Y_i$. Similarly, those scanning signal lines GL which select the pixel rows $A_{i+1}$, $A_{i+2}$, etc. are indicated by $Y_{i+1}$, $Y_{i+2}$, etc. These signal lines GL are connected with a vertical scanning circuit.

The central portion of FIG. 2A shows a cross section of one pixel. The left portion shows a cross section of the left ends of the transparent glass plates SUB1 and SUB2 at which leads going outward exist. The right portion shows a cross section of the right ends of the plates SUB1 and SUB2 at which any lead going outward does not exist.

Referring to FIG. 2A, a seal member SL shown to be located at the left and at the right acts to hermetically seal the liquid crystal LC and extends over the whole fringe of the glass plates SUB1, SUB2 except for a port (not shown) through which the liquid crystal is introduced. The seal member SL is made from epoxy resin, for example.

The common transparent electrode ITO2 on the side of the upper transparent glass plate SUB2 is connected at at least one location with a lead going outward by means of a silver paste SIL, the lead being located on the side of the lower plate SUB1. This lead is formed by a transparent electrode layer ITO1.

The orientation films ORI1 and ORI2, the transparent pixel electrode PIX, and the common transparent electrode ITO2 are formed inside the seal member SL. A polarizing plate POL is formed on the outer surface of the lower transparent glass plate SUB1. Another polarizing plate POL is formed on the outer surface of the upper transparent glass plate SUB2.

An equivalent circuit of the liquid crystal display shown in FIGS. 1-4 and its operation are next described by referring to FIG. 5. We now take the pixel located at the right uppermost position of FIG. 5 as an example. The electrode PIX of this pixel is formed, corresponding to a red filter R, and accessed by the (i+2)-th drain line D ($X_{i+2}R$) and the i-th scanning line G ($Y_i$) via the thin-film transistor TFT. The pixel electrode PIX is electrostatically coupled to the neighboring (i+1)-th scanning line $Y_{i+1}$ by the auxiliary capacitor $C_{add}$. A parasitic thin-film transistor $Q_1$ is formed between the electrode of the auxiliary capacitor $C_{add}$ connected with the pixel electrode PIX and the (i+2)-th red signal line $X_{i+2}R$. Also, a parasitic thin-film transistor $Q_2$ is formed between this electrode and the (i+2)-th green signal line $X_{i+2}G$ (not shown). The transistors $Q_1$ and $Q_2$ are shown to be located at a high left position and a high right position, respectively. The upper electrode CH of the auxiliary capacitor forms a source common to both transistors. The left and right signal lines DL form the drains of the transistors $Q_1$ and $Q_2$, respectively. The scanning line GL crossing these source and drains forms a gate common to both transistors.

Referring back to FIG. 5, the operation of the present circuit is now described. As an example, when the scanning line $Y_i$ is energized, the video signal wiring circuit applies a signal voltage to the i-th pixel electrode PIX. This voltage is written to the capacitance of the liquid crystal and also to the auxiliary capacitor $C_{add}$. At this time, the potential on the common electrode of the liquid crystal and the potential on the (i+1)-th scanning line $Y_{i+1}$ are given associated DC potentials. In other words, both common electrode and scanning line $Y_{i+1}$ are grounded in terms of alternating current. Therefore, the auxiliary capacitor $C_{add}$ is equivalently connected in parallel with the capacitance of the liquid crystal. That is, the auxiliary capacitor $C_{add}$ helps maintain the writing voltage during the period between the instant at which the thin-film transistor TFT is turned off after video information is written and the instant at which the transistor is subsequently turned on.

When the (i+1)-th scanning line $Y_{i+1}$ is subsequently energized, the parasitic transistors $Q_1$ and $Q_2$ of the i-th row are turned on. As a result, video signal which should be applied to the (i+1)-th row will be applied also to the pixel electrodes of the i-th row via these parasitic transistors. Therefore, when the transistors $Q_1$ and $Q_2$ are turned on, video signal will be incorrectly written to the electrodes PIX. To avoid this undesirable situation, the circuit shown in FIG. 5 makes scans from the lowest position to the highest position. When the (i+1)-th scanning line $Y_{i+1}$, for example, is energized, video signal is incorrectly written to the pixel electrodes of the i-th row. However, when the i-th scanning line $Y_i$ is subsequently energized, the information stored on the pixel electrodes of the i-th row is immediately corrected, i.e., the electrodes are rewritten. The correct information is kept retained and displayed on the i-th row during the period between the instant at which the scanning line $Y_{i-1}$ (not shown) is next energized and the instant at which the scanning line $Y_{i+1}$ is again energized. Accordingly, the aforementioned period of erroneous writing can be substantially neglected as compared with the scanning period of one frame. Assuming that the number of the scanning lines is 600, the period of erroneous writing is 1/600, which presents no visual problems. If scans are made in a reverse direction, e.g., from the highest position to the lowest position in FIG. 5, then the time for which information is stored incorrectly is 599/600, which produces serious parasitic effects.

In portion a located at an upper left position in FIG. 1, the boundary line AS, GI (second mask contour line #2) between the amorphous silicon layer AS and the gate-insulating film GI extends upwardly over a considerable distance so as to overlie the gate line GL. A cross section of this extension is shown in FIG. 2C. As can be seen from this figure, the amorphous silicon layer AS and the gate-insulating film GI are cut substantially midway between the drain line DL and the upper electrode CH of the auxiliary capacitor $C_{add}$. A gate layer g consisting of an opaque material such as chromium is not formed near this location at which the layer AS and the film GI are cut. Therefore, if back light falls on the glass plate SUB1, then the light is allowed to travel upward and leak. If the amorphous silicon layer AS is continuous at said location, then leaking light produces pairs of electrons and positive holes in the amorphous silicon layer AS. The leaking light makes the amorphous silicon layer AS conductive, thus creating the possibility that the drain line DL ($X_iG$) and the upper electrode CH of the capacitor conducts at all times or that leak current flows between them. The division of the amorphous silicon layer AS serves to prevent such photoconduction. Preferably, the division line extends into the gate line GL which blocks light.

Referring again to FIG. 1, a notch b located at an upper position prevents photoconduction between the upper electrode CH of the capacitor and the data line DL ($X_iB$). Another notch c located at a lower left position prevents photoconduction between drain lines $X_iG$ and $X_iB$ when scanning line $Y_i$ is energized. A notch d located at a lower left position prevents photoconduction between source SD1 and the upper electrode CH of the capacitor of the (i−1)-th row.

Figure 6:
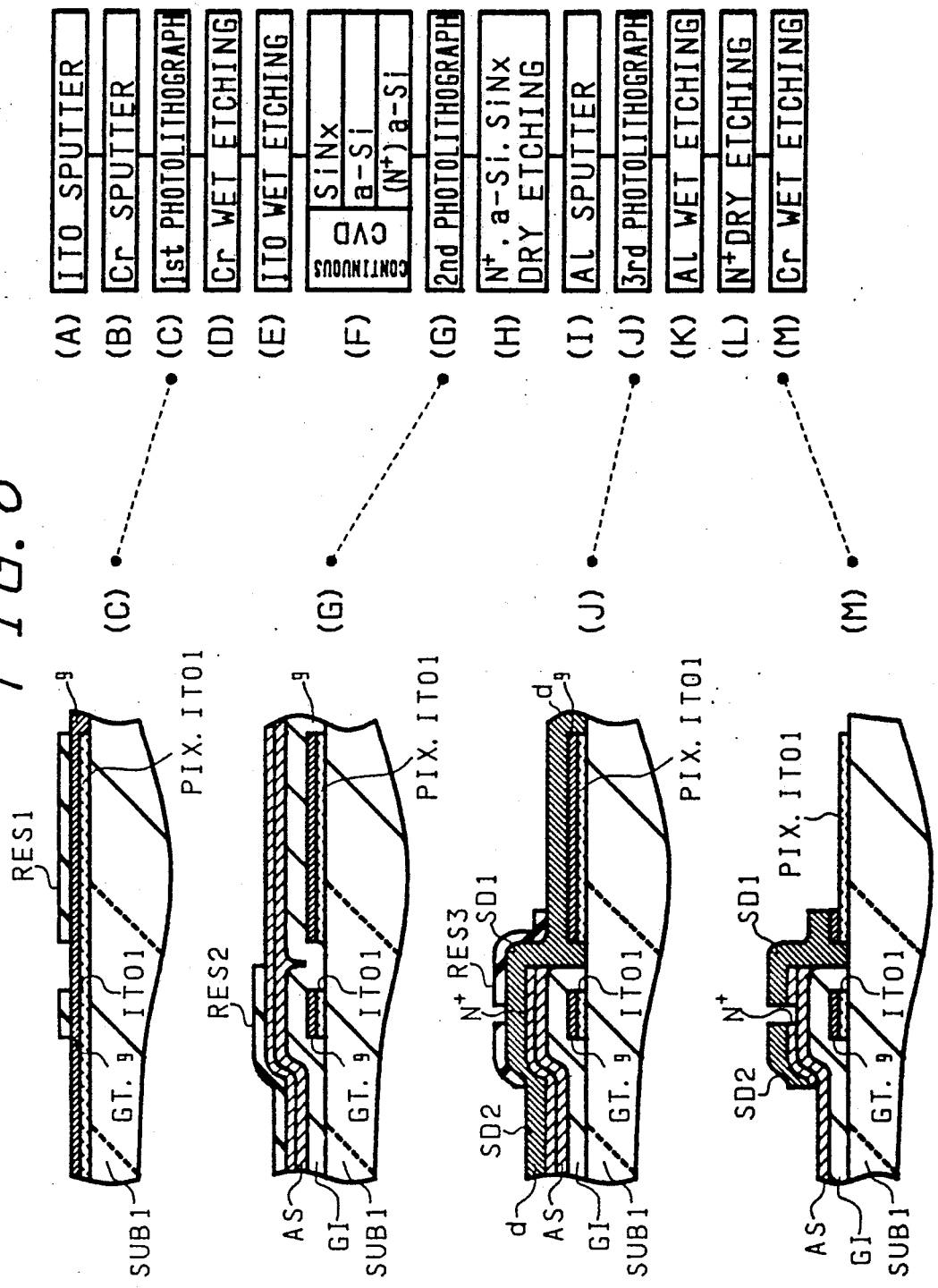
FIG. 6 is a diagram illustrating a method of fabricating the device shown in FIG. 1.

The fabrication process carried out until the formation of the protective film PSV1 (FIG. 2A) on the side of the glass plate SUB1 is now described by referring to FIG. 6. A flowchart illustrating a sequence of manufacturing steps A-M is shown at the right. Four cross sections at the left show the central portion of FIG. 2A when steps C, G, J, M are respectively completed.

In step (A) of FIG. 6, a transparent conductive material consisting of indium tin oxide (ITO) is deposited on the cleaned glass plate SUB1 by sputtering up to a thickness of about 1200 Å. This layer of the conductive material is used to form leads extending outwardly from the pixel electrodes PIX and from around the glass plates.

In step (B), chromium which is a preferred conductive material because it blocks light is deposited on the transparent conductive layer of ITO by sputtering up to a thickness of approximately 1200 Å. The formed layer g is employed as the gates GT, the scanning lines GL, and the lower electrode CL of the auxiliary capacitor $C_{add}$.

In step (C), photoresist is applied to the chromium film g. Selected portions of the laminate are exposed to light, using a mask. Then, the laminate is developed. As a result, photoresist RES1 is left on only desired portions of the Cr film and ITO film. The remaining photoresist is indicated by #1 in FIG. 1 and at positions corresponding to the pixel electrodes PIX, the gates GT, the scanning lines GL, and the lower electrode CL of the capacitor.

In step (D), the Cr film is selectively etched away, using the photoresist RES1 left in step (C) as a mask.

In step (E), the ITO film is selectively etched away, using either the photoresist or the remaining Cr film as a mask. Then, the photoresist is fully removed.

In step (F), the glass plate SUB1 on which the patterned Cr film and ITO film are formed is placed into a plasma-assisted CVD apparatus. The insulation film GI consisting of a $Si_3N_4$ film is formed to a thickness of about 3000 Å within a reducing atmosphere of plasma. At this time, the ITO film including an oxide is covered with the Cr film and so the oxide does not adversely affect the deposition of $Si_3N_4$. Subsequently, the composition of the supplied gas is changed without exposing the glass plate SUB1 to the atmosphere to form the I-type amorphous silicon layer AS not doped with the impurity determining the conduction type. The thickness of the silicon layer is about 2000 Å. Thereafter, gas containing phosphorus is supplied to form the heavily doped N-type amorphous silicon layer N+ to a thickness of about 200 Å.

In step (G), photoresist REG2 is patterned by the same photographic techniques as in step (C) and then selectively removed.

In step (H), using the remaining resist RES2, the heavily doped layer N+, the I-type silicon layer AS, and the silicon nitride layer GI are selectively removed by an apparatus utilizing plasma. The planar shape of the remaining silicon layer AS is indicated by #2 in FIG. 1. In order to increase the transmissivity, the portions not corresponding to the pixel electrodes PIX to be formed and the portions a–d for preventing leaking current are removed. The insulation film GI is selectively removed in the same pattern as the silicon layer N+ and the I-type silicon layer AS. The silicon layer AS and the insulation film GI are removed at locations at which the fringes of the source SD1 and the upper electrode CH of the capacitor overlap with the fringes of the pixel electrodes PIX to make electrical connection between them.

In step (I), aluminum is deposited on the whole surface of the glass plate SUB1 by sputtering to a thickness of about 5000 Å. Thus, an aluminum film d is formed.

In step (J), photoresist RES3 is developed into the form indicated by #3 in FIG. 1 by photographic techniques.

In step (K), the laminate including the glass plate SUB1 is immersed in an etchant to etch away the aluminum film, using the resist as a mask. Thus, the sources SD1, the drains SD2, the upper electrodes CH of capacitors, and the signal lines DL are formed. Although the etchant for the aluminum film can easily dissolves away the ITO film, the ITO film is not dissolved because it is covered with the Cr film.

In step (L), those portions which have no longer any of the electrodes SD1, SD2, CH do not require the heavily doped layer N+ having a low electrical resistance; rather presence of the heavily doped layer N+ will produce leak current. Therefore, the doped layer N+ is selectively removed by plasma in the same pattern as the aluminum film. In this case, to ensure the removal of the doped layer N+, the I-type silicon layer AS is slightly ground by plasma.

In step (M), the opaque chromium film left on the pixel electrodes PIX in the previous step (L) is selectively etched away, using the resist RES3 or the remaining Al film as a mask. The silicon layer AS and the silicon film GI are left on the gates GT, on the scanning lines GL, and on the lower electrode CL of each capacitor by the aforementioned first mask pattern #1. Hence, desired portions of the chromium film are not etched away.

In the present example, the gates, their leads, the lower electrodes of the capacitors, their leads, and the pixel electrodes are patterned in an indistinguishable manner, using the same first mask pattern #1. The second mask pattern #2 for patterning the insulation film GI etc. is combined with the third mask pattern #3 for patterning the sources, the drains, etc., whereby the pixel electrodes can be patterned without the need to use a dedicated mask pattern.

Figure 8A:
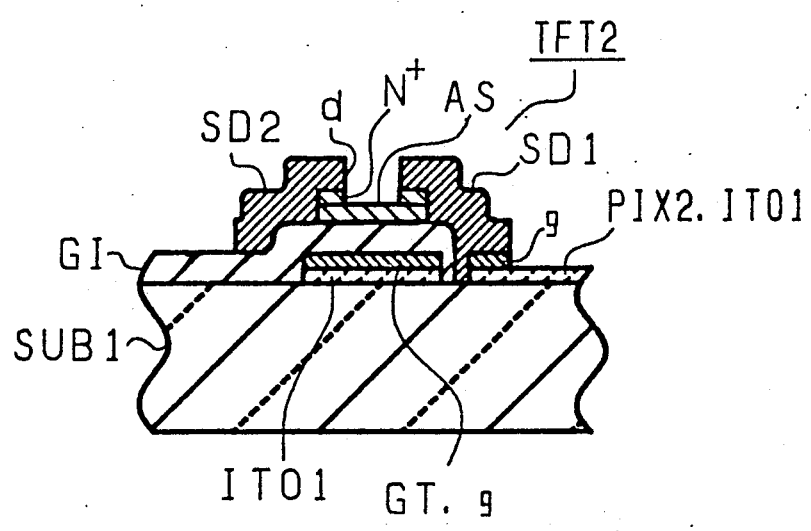
FIGS. 8A and 8B are cross-sectional views taken on lines 8A—8A and 8B—8B, respectively, of FIG. 7.
Figure 8B:
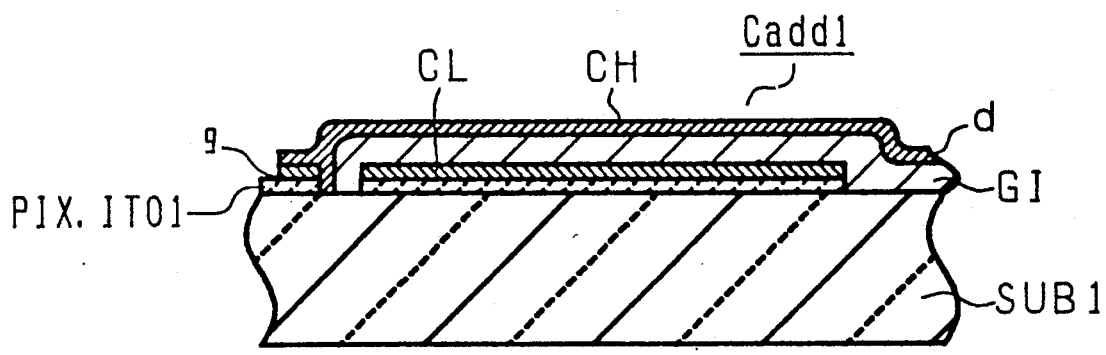

Referring to FIGS. 7, 8A, and 8B, there is shown another active matrix type liquid crystal color display according to the invention. This display is similar to the display already described in conjunction with FIGS. 1, 2A, 2B, 2C, and 3 except for the following features.

(1) A mask pattern #4 used for patterning only the amorphous I-type silicon layer AS is added.

(2) The silicon layer AS is formed only at locations where thin-film transistors TFT1-TFT3 intersect the gate lines GL and the drain lines DL.

(3) The pixture element which comprises thin-film transistor TFT, a pixel electrode PIX, and an auxiliary capacitor $C_{add}$ and is energized by the same drain line DL and gate line GL is divided into three.

(4) At the locations of the thin-film transistors TFT1-TFT3, the underside of the I-type silicon layer AS is totally covered with the gate GT.

The features (2)-(4) are next described in greater detail.

Feature (2)

As shown in FIG. 8B, in each of auxiliary capacitor $C_{add}1$-$C_{add}3$, only one gate-insulating film GI exists between the upper electrode CH and the lower electrode CL. In the configuration shown in FIG. 2B, the silicon layers N+ and AS intervene. Consequently, the capacitance per unit area can be increased greatly.

At the intersections of the gates GL and the drains DL, the silicon layer AS exists in addition to the gate-insulating film GI. During photographic process, short circuit between the gate lines and the drain lines which would otherwise be caused by dust can be prevented. This advantage will become more apparent from the description made later of manufacturing method.

Feature (3)

When the effective display area of the whole liquid crystal display is increased, if the number of pixels is fixed, then it is necessary to increase the area of each pixel. In this case, if a pixel is defective, it can be clearly discerned as a white or black spot with the naked eye. As shown in FIG. 7, where each pixel is divided into plural portions, the defect seems small unless all the divided portions are at fault. Accordingly, a liquid crystal display having so many defects that it would normally be regarded as substandard may be accepted owing to the novel division system, because the possibility that the whole pixel is at fault is reduced greatly. Hence, the manufacturing yield is enhanced.

What are divided are not only the pixel electrodes PIX but also the thin-film transistors TFT, because thin-film transistors have high failure rate. As the transistors TFT and the electrodes PIX are divided, the auxiliary capacitors $C_{add}$ are divided. In the present example, the divisor is 3. The number of divided portions of each pixel is determined, considering both minimum size distinguished with the naked eye and area of each pixel into account. The pixel electrodes PIX-1-PIX3 are substantially identical in area. Also, the transistors TFT1-TFT3 are almost identical in channel width/channel length (W/L). The auxiliary capacitors $C_{add}1$-$C_{add}3$ are alike in capacitance value.

The divided portions of the thin-film transistors TFT1-TFT3 are connected with the same scanning line $Y_i$ and with the same signal line DL. Also, the lower electrodes CH of the auxiliary capacitors $C_{add}1$-$C_{add}3$ are connected with the same scanning line $Y_{i+1}$. The division necessitates no addition of leads.

The amorphous silicon layer AS forming the channel regions of the transistors TFT1-TFT3 is made common to the regions to reduce the number of steps of the silicon layer AS crossed by the signal lines DL, as well as the total length of the lines. Hence, the possibility of line breaking is reduced. Since none of the auxiliary capacitors $C_{add}1$-$C_{add}3$ have the silicon layer AS, the division does not produce any parasitic transistor. If the capacitor shown in FIG. 1 is simply divided into three, then parasitic transistors are produced between the successive three portions because of the presence of the silicon layer AS.

Feature (4)

As shown in FIG. 7, the gate GT is so formed that it fully covers the underside of the semiconductor layer AS and that it is larger than the layer AS. Accordingly, where a fluorescent light or the like emitting back light is mounted below the glass plate SUB1, the opaque chromium gate GT shields the semiconductor layer AS against the back light. As a result, it is less likely that the illumination of light causes photoconduction, i.e., deterioration of the cutoff characteristics of the thin-film transistors TFT. Essentially, the size of the gate GT depends on the ratio W/L that determines the mutual conductance $G_m$. W is the channel width equal to the sum of the distance of the source SD1 to the drain SD2 and allowance necessary to align the gate with the source and the drain. L is the channel length, i.e., the distance between the source and the drain. In the present example, of course, the gate is made larger than the above-described essential size.

If necessary, the transistors TFT1-TFT3 are shielded from light coming from the side of the glass plate SUB2 by forming a pattern of a chromium layer or organic filter layer.

Figure 4:
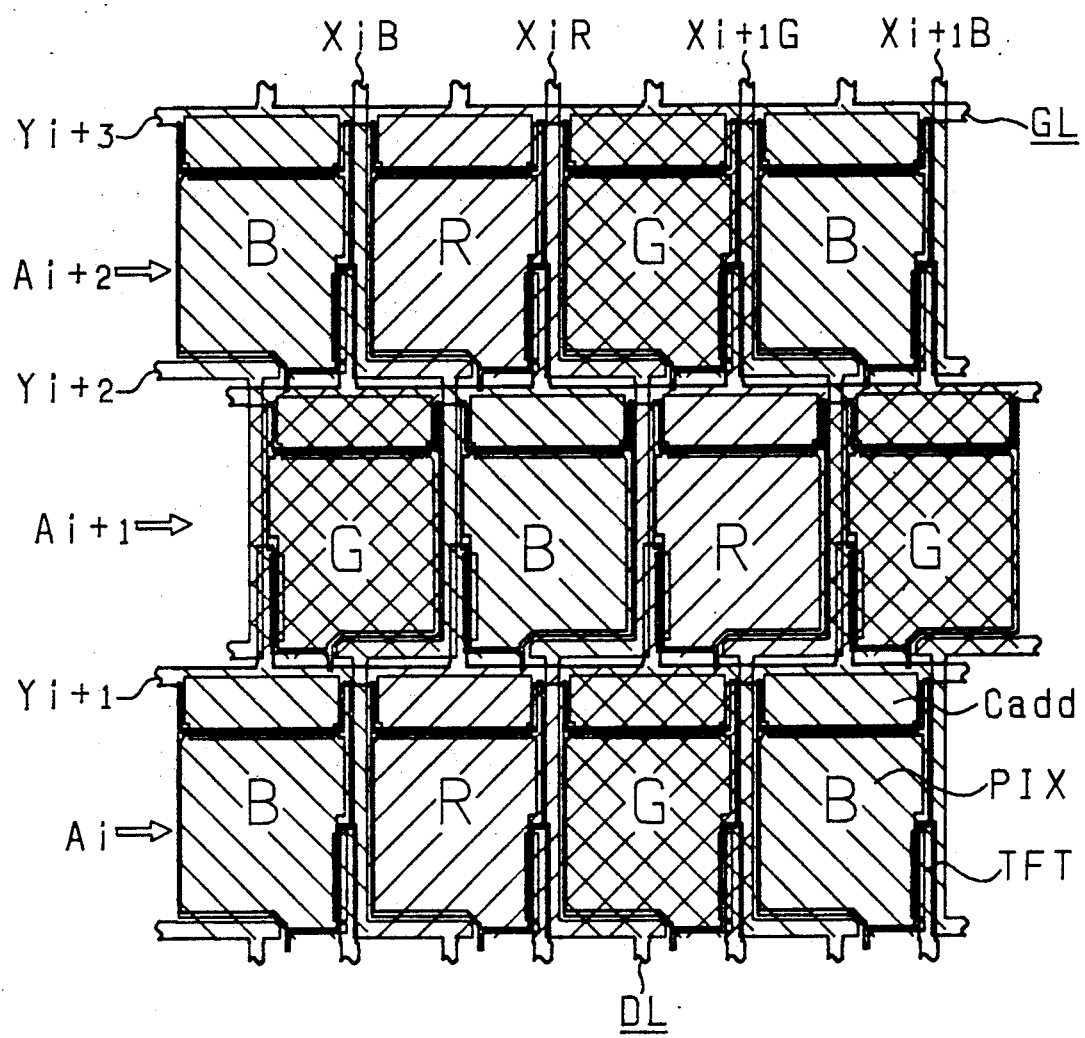
FIG. 4 is a view similar to FIG. 3, but in which color filters are placed on the pixels.
Figure 9:
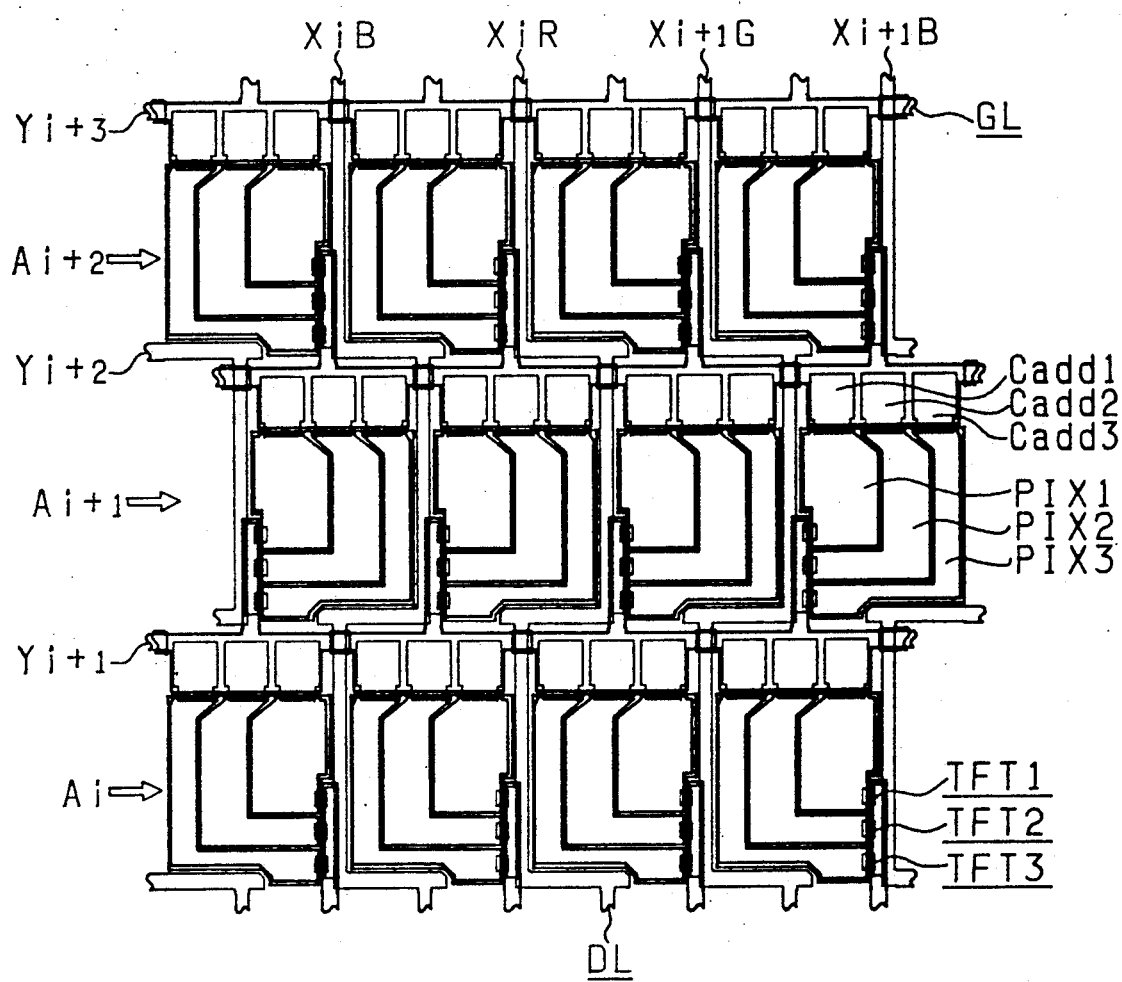
FIG. 9 is a plan view of main portions of the liquid crystal display shown in FIG. 7, but in which the pixel shown in FIG. 7 and similar pixels are arranged.
Figure 10:
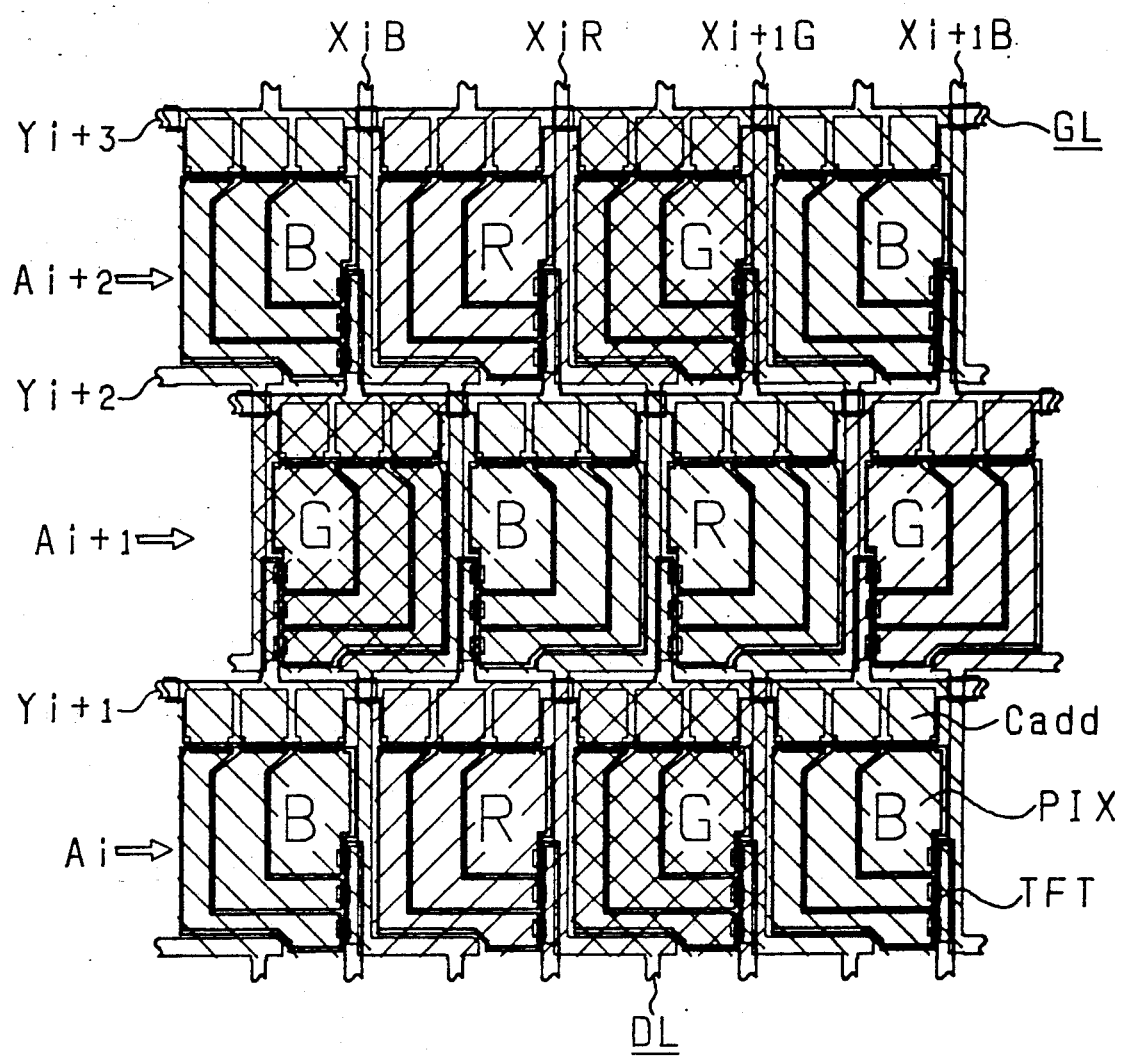
FIG. 10 is a view similar to FIG. 9, but in which color filters are placed on the pixels.

FIGS. 9 and 10 show devices in which the pixel shown in FIG. 7 is repeatedly arranged in the same way as the device shown in FIGS. 3 and 4. In the device shown in FIG. 10, color filters in the form of dots are placed on the pixels. The devices shown in FIGS. 9 and 10 are similar to the first-mentioned device and so they are not described herein. Equivalent circuits of the liquid crystal displays, methods of driving them, and their operation are next described.

Figure 11:
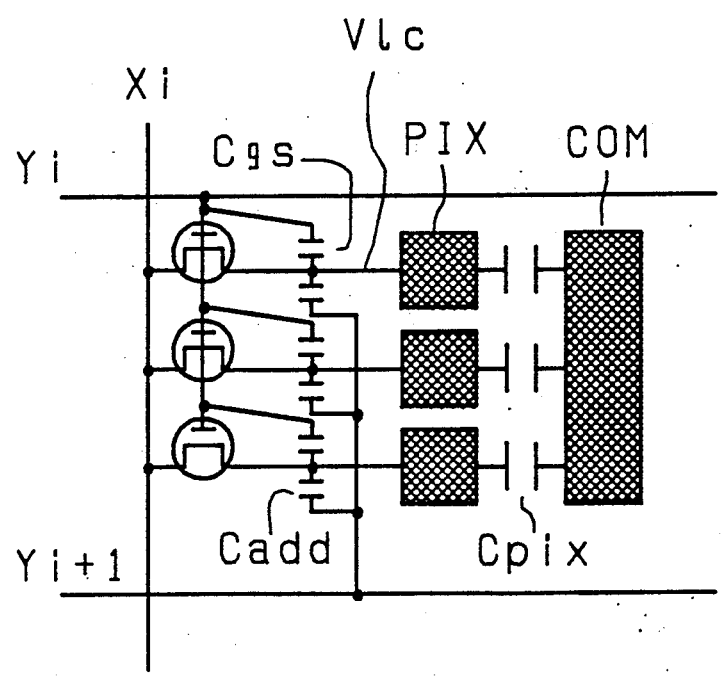
FIG. 11 is an equivalent circuit diagram of the pixel shown in FIG. 7.

FIG. 11 shows an equivalent circuit of one pixel, and in which the prefixes given to the symbols indicating divided portions in FIG. 7 and other figures are omitted. $C_{gs}$ is an added capacitance formed by the gate GT and the source SD1 of the thin-film transistor TFT. The dielectric film of the added capacitance $C_{gs}$ is formed by the insulation film GI. $C_{pix}$ is a liquid crystal capacitance formed between the transparent pixel electrode ITO1 (PIX) and the common transparent pixel electrode ITO2. The dielectric film of the capacitance $C_{pix}$ is formed by liquid crystal LC, the protective film PSV1, the orientation films ORI1 and ORI2. $Vl_c$ indicates the potential at the neutral point.

The capacitive element $C_{add}$ acts to reduce the effects of change $\Delta V_g$ in the gate potential on the neutral point potential $Vl_c$ (or potential on the pixel electrode) when the transistor TFT switches into other state. The amount of change of the neutral point potential caused by the gate potential change $\Delta V_g$ is given by $$\Delta Vl_c = \{(C_{gs}/(C_{gs} + C_{add} + C_{pix})\} \times \Delta V_g$$

Because of this amount of change $\Delta Vl_c$, DC component is applied to the liquid crystal. As the capacitance $C_{add}$ is increased, the amount of change is reduced. The capacitance $C_{add}$ also functions to prolong the time for which electric discharge takes place. After the transistor TFT is biased off, the capacitance $C_{add}$ retains video information for a long time. Reduction in the direct current applied to the liquid crystal LC increases the life of the liquid crystal LC and reduces the sticking of the liquid crystal display, i.e., the tendency of the image presented on the display to remain after the image is switched to another.

As described already, as the gate GT is large enough to fully cover the semiconductor layer AS, it overlaps with the source SD1 and the drain SD2 with greater area, increasing the parasitic capacitance $C_{gs}$. Therefore, the potential $Vl_c$ at the neutral point is affected more by the gate signal or scanning signal $V_g$. However, this demerit can be eliminated by providing the retaining capacitor $C_{add}$.

The capacitance of the capacitive element $C_{add}$ is so designed that it is approximately 4 to 8 times as large as the liquid crystal capacitance $C_{pix}$, i.e., $4\,C_{pix} < C_{add} < 8\,C_{pix}$, and approximately 8 to 32 times as large as the added capacitance $C_{gs}$ ($8\,C_{gs} < C_{add} < 32\,C_{gs}$), considering the writing characteristics of pixels.

Figure 13:
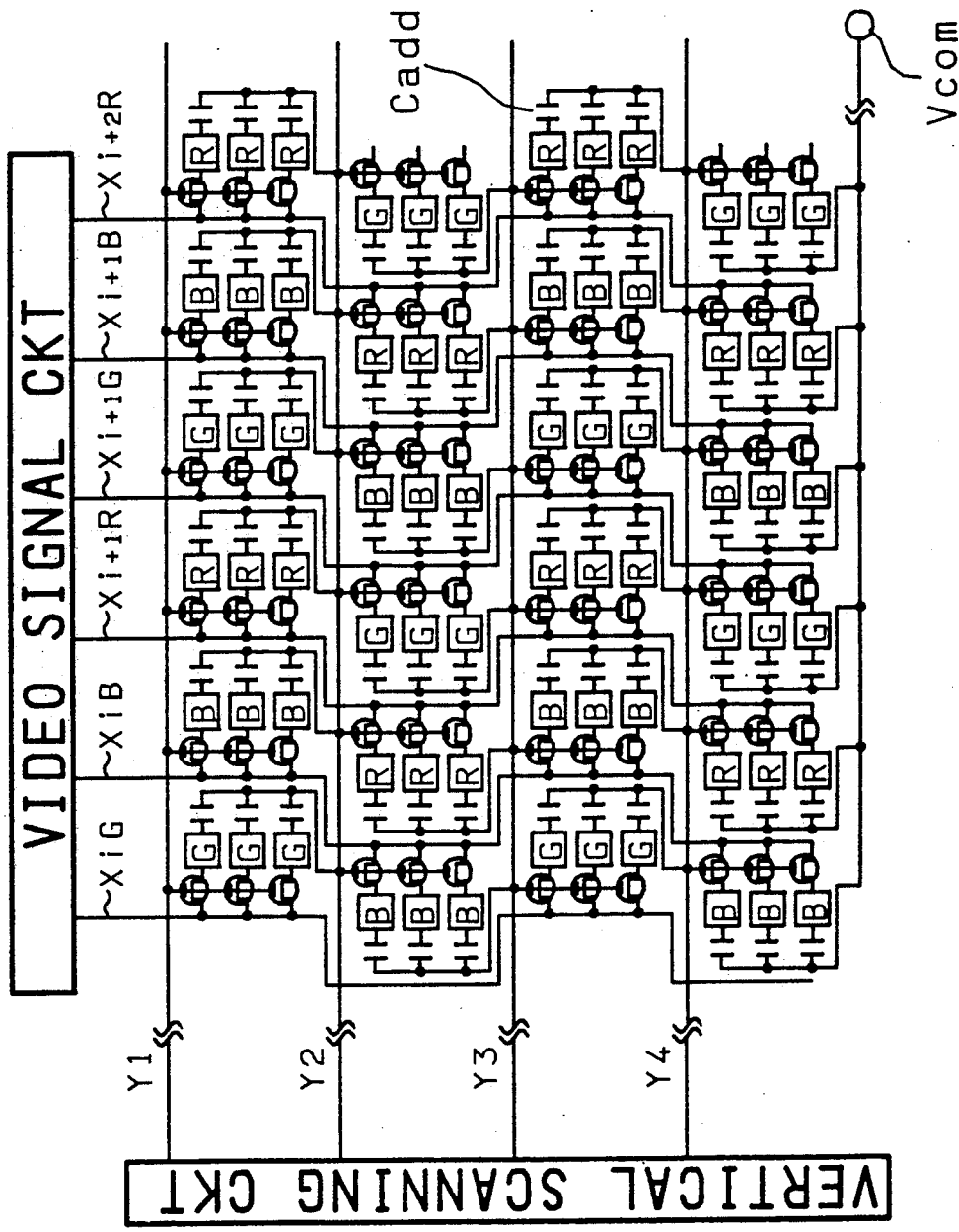
FIGS. 13 and 14 are equivalent circuit digrams of main portions of active matrix type liquid crystal displays using the same pixels as the pixel shown in FIG. 7.

The character display portion of the liquid crystal display in which each transparent pixel electrode PIX is equipped with retaining capacitive elements $C_{add}$ is designed as shown in FIG. 13 which is an equivalent circuit diagram of the character display portion. This character display portion consists of repeated arrangement of a unit comprising a pixel, a scanning signal line GL, and a video signal line DL. The scanning signal line GL of the final or first stage that is used as a capacitance electrode line is coupled to the common transparent pixel electrode $V_{com}$, which is connected to outgoing leads at the fringes of the liquid crystal display by the silver paste SL as shown in FIG. 2A. Further, the conductive layer (ITO1) of the outgoing leads is fabricated in the same step as the pixel electrode PIX. Consequently, the scanning signal line GL, or capacitance electrode line, of the final stage can be easily connected to the common transparent pixel electrode.

By coupling the capacitance electrode line of the final stage to the potential $V_{com}$ of the common transparent pixel electrode of the pixel in this way, the capacitance electrode line of the final stage can be formed integral with a part of the conductive layer forming the outgoing leads. In addition, the capacitance electrode line of the final stage can be connected with the common transparent pixel electrode with a simple configuration, because the common electrode is connected with the outgoing leads.

Figure 12:
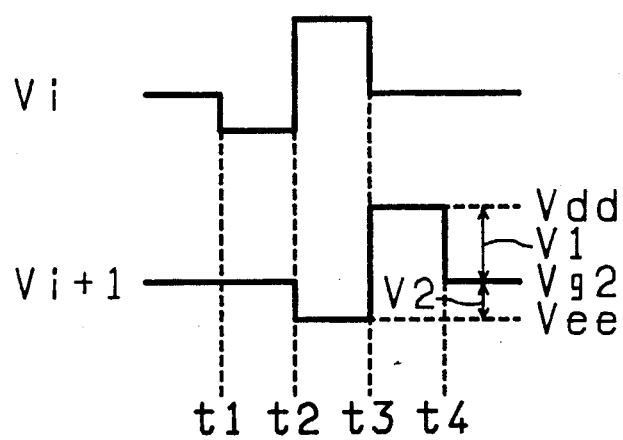
FIG. 12 is a time chart showing the driving voltages applied to scanning signal lines according to the direct cancel system.

The liquid crystal display is capable of further decreasing the DC component applied to the liquid crystal LC by controlling the driving voltage on the scanning signal lines DL as shown in the waveform diagram of FIG. 12, based on the DC cancel system disclosed in Japanese Patent Application No. 95,125/1987 filed by the present applicant. In FIG. 12, $V_i$ is the driving voltage on an arbitrary scanning line GL. $V_{i+1}$ is the driving voltage on the scanning line GL of the next stage. $V_{ee}$ is a low-level driving voltage $V_{dmin}$ applied to scanning lines GL. $V_{dd}$ is a high-level driving voltage $V_{dmax}$ applied to scanning signal lines GL. The amounts of changes $\Delta V_1$–$V_4$ in the voltage $Vl_c$ at the neutral point (FIG. 11) at instants of time ($t = t_1$ to $t_4$) are as follows:

$$\Delta V_1 = -(C_{gs}/C) \cdot V_2 \quad \text{at } t = t_1$$
$$\Delta V_2 = +(C_{gs}/C) \cdot (V_1 + V_2) - (C_{add}/C) \cdot V_2 \quad \text{at } t = t_2$$
$$\Delta V_3 = -(C_{gs}/C) \cdot V_1 + (C_{add}/C) \cdot (V_1 + V_2) \quad \text{at } t = t_3$$
$$\Delta V_4 = -(C_{add}/C) \cdot V_1 \quad \text{at } t = t_4$$

The total capacitance of the pixels is given by $$C = C_{gs} + C_{pix} + C_{add}$$

If the driving voltage applied to scanning signal line GL is sufficiently high, then the DC voltage applied to the liquid crystal LC is given by $$\Delta V_3 + \Delta V_4 = (C_{add} \cdot V_2 - C_{gs} \cdot V_1)/C$$

Thus, if the relations $C_{add} \cdot V_2 = C_{gs} \cdot V_1 = 0$ are satisfied, then the DC voltage applied to the liquid crystal LC is zero.

It is to be noted that changes in the voltage $V_i$ applied to a scanning line at instants $t_1$ and $t_2$ affect the potential $Vl_c$ at the neutral point, but during the period between instants $t_2$ and $t_3$, the neutral point potential $Vl_c$ is made equal to the video signal potential through signal line $X_i$. This means that video signal is written sufficiently. The potential applied to the liquid crystal is substantially determined by the potential occurring immediately after the thin-film transistor TFT is turned off. The time for which the transistor TFT does not conduct is much longer than the time for which it conducts. Therefore, in calculating the DC component applied to the liquid crystal, the period beginning at instant $t_1$ and ending at instant $t_3$ can be substantially neglected. It is only necessary to consider the potential occurring immediately after the transistor is biased off, i.e., the transient effects at instants $t_3$ and $t_4$. The polarity of the voltage $V_i$ of the video signal is inverted every frame or every line. The DC component produced by the video signal itself is made zero.

The added capacitance $C_{gs}$ causes the potential $Vl_c$ at the neutral point to drop. In the DC cancel system, the amount of drop is decreased by the driving voltage applied to the retaining capacitive element $C_{add}$ and to the scanning signal line GL, or capacitance electrode line, of the next stage. In this way, the DC component applied to the liquid crystal LC can be reduced to a quite small amount. As a result, the life of the liquid crystal LC of the liquid crystal display can be increased. Of course, where the gates GT are made large to increase the light-blocking effect, the value of the capacitance $C_{add}$ is increased accordingly.

Figure 14:
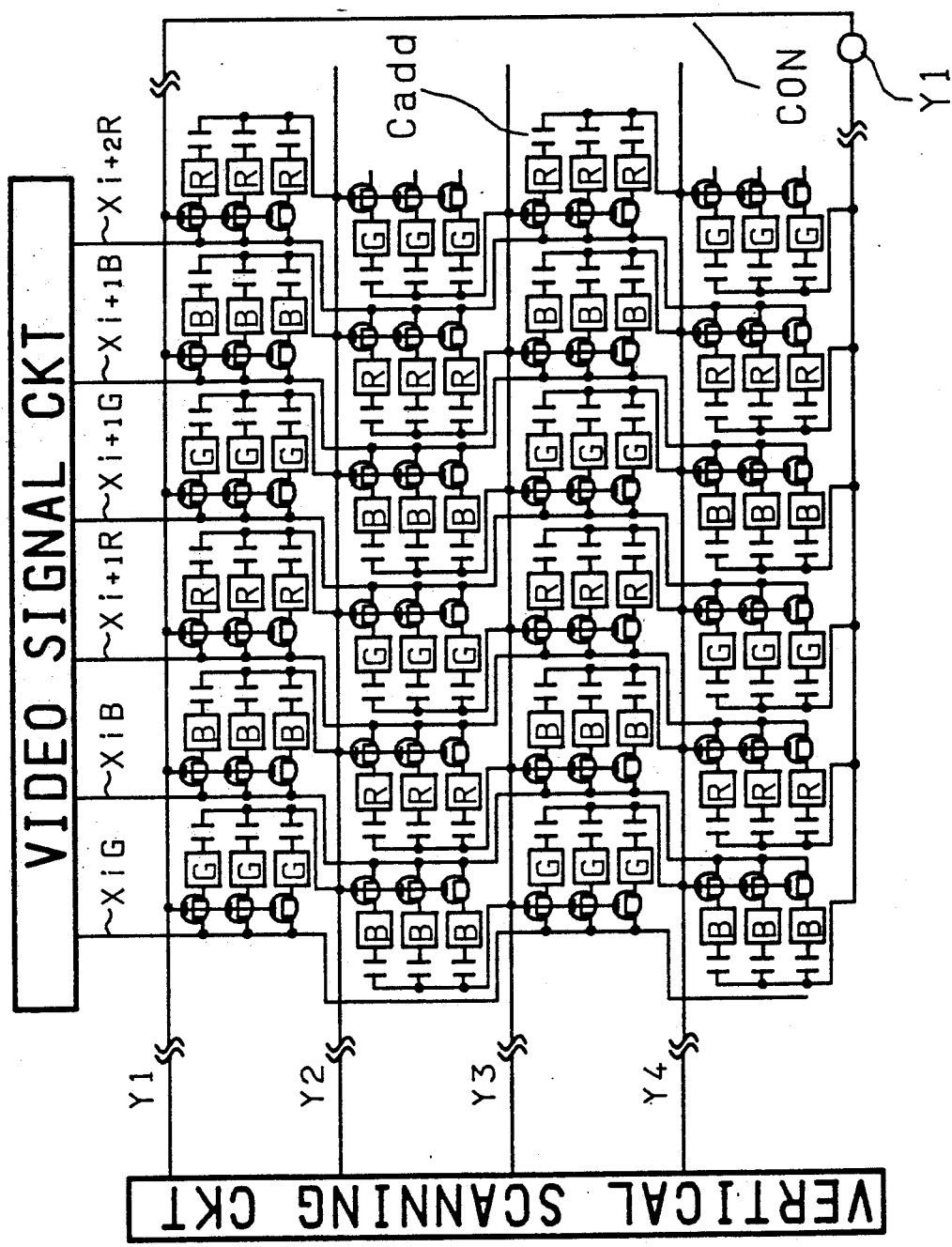

This DC cancel system can be adopted by connecting the scanning signal line GL, or capacitance electrode line, of the first stage with the capacitance electrode line, or scanning signal line GL, of the final stage as shown in the equivalent circuit of the character display portion shown in FIG. 14. In this figure, only four scanning signal line GL are shown for convenience sake. In practice, however, hundreds of scanning signal lines GL are disposed. The scanning signal line GL of the first stage is connected with capacitance electrode line of the final stage either by internal leads formed inside the character display portion or by outgoing leads.

In this manner, in the liquid crystal display, all of the scanning signal lines GL and the capacitance electrode lines can be connected with the vertical scanning circuit by connecting the scanning signal line GL of the first stage with the capacitance electrode line of the final stage. This permits adaption of the DC cancel system. Consequently, the DC component applied to the liquid crystal LC can be reduced. Hence, the life of the liquid crystal LC can be increased.

Figure 15:
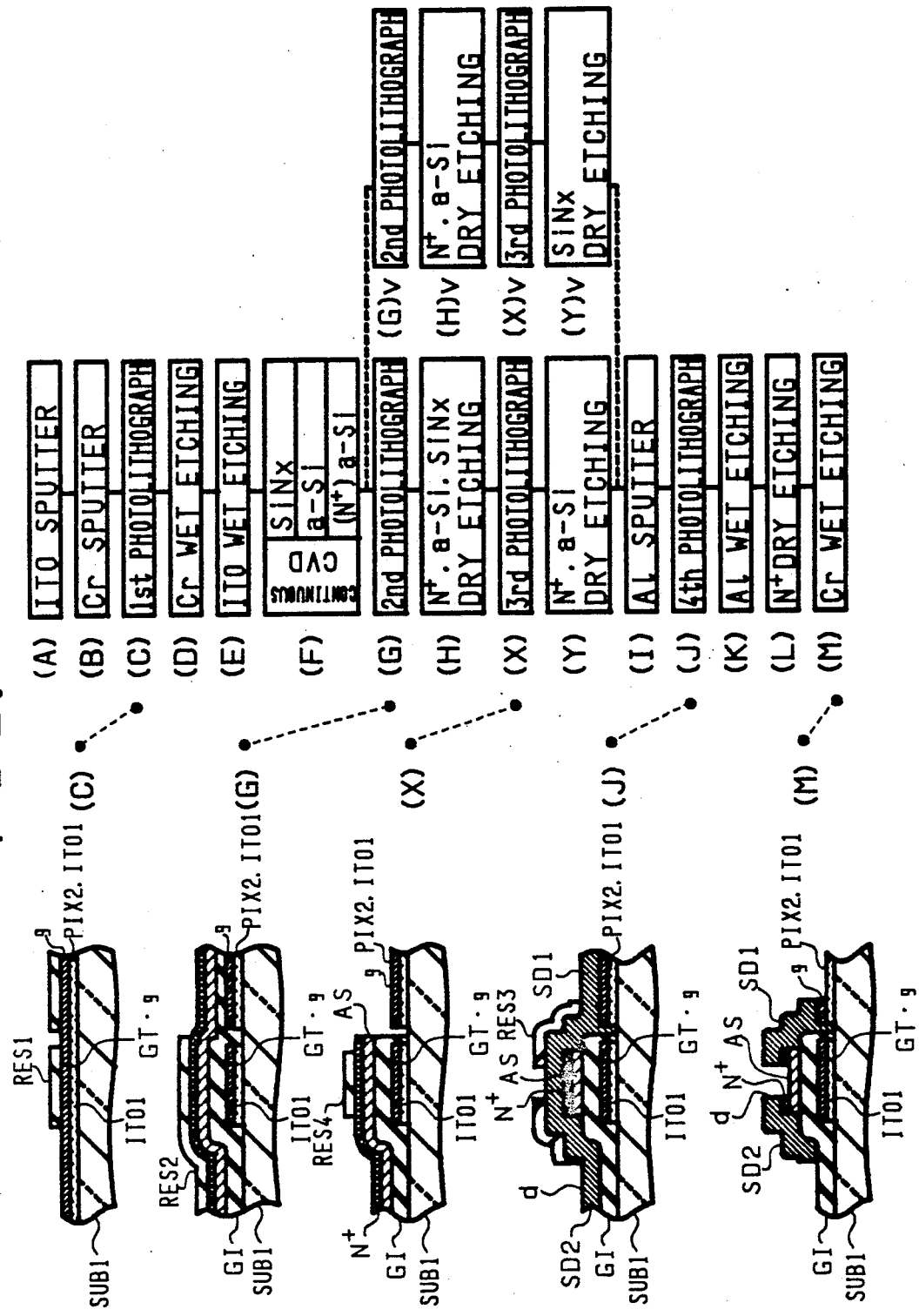
FIG. 15 is a diagram illustrating a method of fabricating the device shown in FIG. 7.

A method of fabricating the liquid crystal display described just above is described now by referring to FIG. 15. As described already, this display differs from the first-mentioned device in that mask pattern #4 used only for the layer N+ and the I-type silicon layer AS is added. Correspondingly, steps X and Y are added as shown in FIG. 15. In step X, mask pattern #4 shown in FIG. 7 is used to treat a laminate by photographic techniques. In steps X and Y, the layer N+ and silicon layer AS are removed excluding the portions in which thin-film transistors TFT1-TFT3 are formed, and excluding the intersections of the signal lines DL and the scanning lines GL.

An alternative series of steps $G_{v}$-$Y_{v}$ is shown to the right of steps G-Y. That is, the second photographic-and-etching step and the third photographic-and-etching step can be interchanged. In this case, the second photographic-and-etching step in step $G_{v}$ uses mask pattern #4, while the third photographic-and-etching step employs mask pattern #2. Where the portion from which the silicon nitride layer GI is removed, i.e., inside of pattern #2, is entirely enclosed within the portion from which the silicon layer AS is removed, i.e., outside of pattern #4 as shown in FIG. 7, the silicon layer AS is completely removed from the portions where $SiN_x$ should be removed immediately before step $Y_v$ is initiated. Therefore, the number of operations carried out to etch away the layers N+ and AS can be decreased by one as compared with the left steps G-Y. In the modified example of steps $G_v$-$Y_v$, at the intersections of the scanning lines GL and the signal lines DL, the photographic-and-etching step for the silicon layer AS is independent of the photographic-and-etching step for $SiN_x$. For this reason, the possibility that pinholes due to dust or the like adhering to a photographic mask are formed at the same position is extremely low. Consequently, short circuits at the intersections can be reduced.

Figure 16:
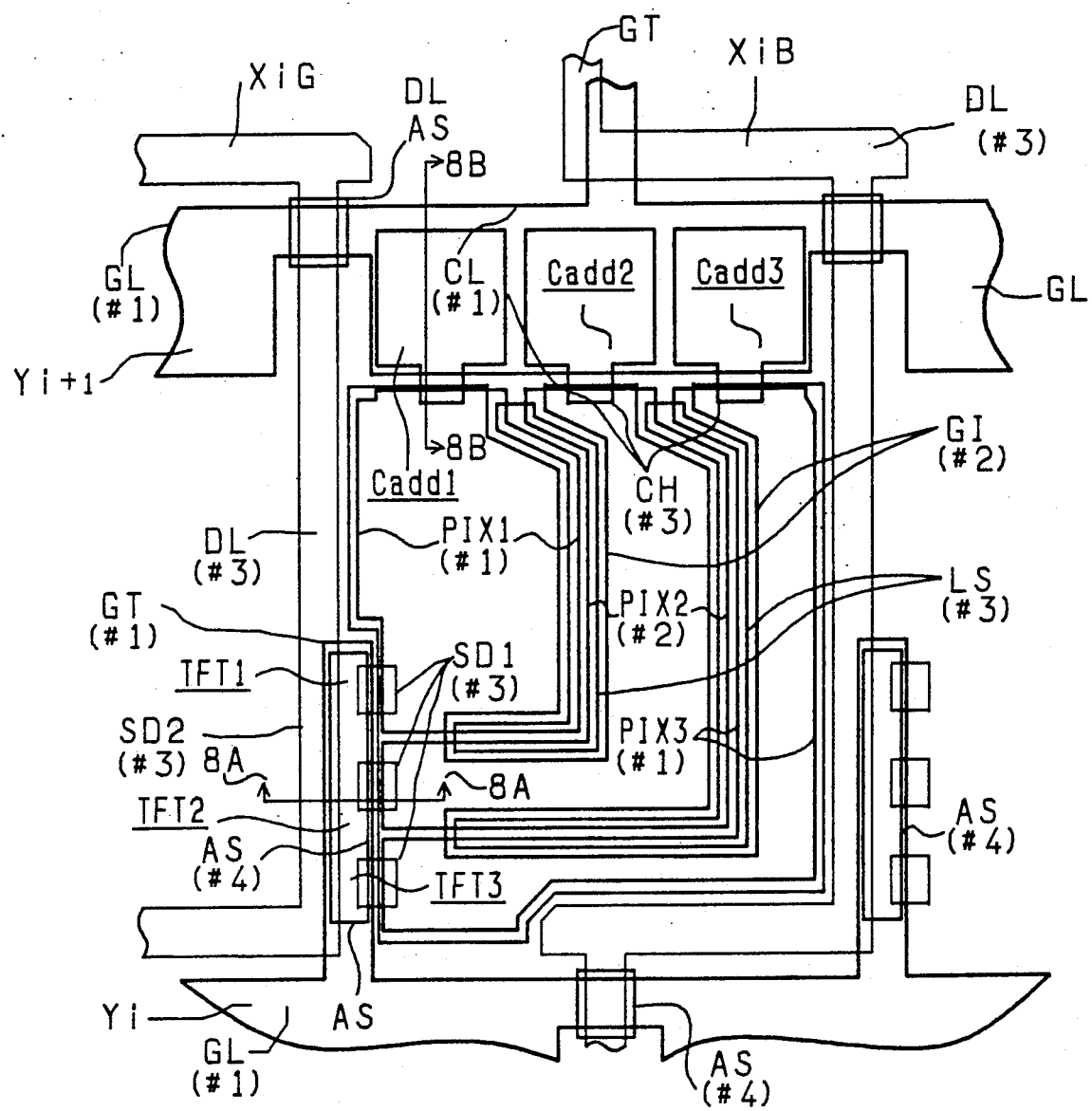
FIG. 16 is a plan view of a further liquid crystal display according to the invention.

FIG. 16 shows an improvement over the pixel shown in FIG. 7. This improved pixel is characterized in that a light-blocking aluminum layer LS indicated by hatching is formed so as to fill up the gap between the divided portions of pixel electrodes PIX1-PIX3. Therefore, if back light or other light coming from the side of the glass plate SUB1 leaks through the gaps between the divided portions of the pixel electrodes, the light is blocked by the film LS. Hence, contrast is improved as compared with the device shown in FIGS. 7, 8A, 8B. The light-blocking aluminum film LS is flush with the source SD1, the drain SD2, the signal line DL, and the upper electrode CH of the capacitor. Therefore, no additional step is needed. A patterned gate-insulating film GI is formed around the light-blocking film, which prevents short circuit of the divided portions of pixel electrodes PIX1-PIX3.

While the invention has been described in its preferred embodiments, it is to be understood that the invention is not limited thereto but may be otherwise variously embodied without departing from the spirit and scope of the invention.

For example, each pixel of the character display portion of the novel liquid crystal display can be divided into two or four. However, if the number of divided portions of each pixel is too large, then the rate of aperture decreases. Therefore, it is adequate to divide each pixel into two or four as mentioned already.

Typical examples of the invention yield advantages as described briefly below.

$Si_3N_4$ is deposited on transparent electrodes including oxide within a reducing atmosphere, the electrodes being coated with a metal layer including no oxide. Therefore, the oxide included in the electrodes does not adversely affect the deposition of $Si_3N_4$.

When an Al layer is etched, indium tin oxide (ITO) film is coated with a Cr film and so the ITO film is not dissolved by the etchant.

In the present example, the gates, their leads, the lower electrode of each capacitor, its leads, and the pixel electrodes are patterned in an indistinguishable manner, using the first mask pattern #1. The second mask pattern #2 for patterning the insulation layers GI etc. is combined with the third mask pattern #3 for patterning sources, drains, etc. This enables the pixel electrodes to be patterned without using any dedicated mask pattern.

Since the gate GT is made larger than the semiconductor layer AS, light is blocked effectively. Also, the cutoff characteristics of thin-film transistors TFT are improved. In this case, the added parasitic capacitance $C_{gs}$ between the gate and the source increases, producing an undesirable effect. However, this can be compensated for by adding auxiliary capacitance $C_{add}$ or by driving auxiliary capacitance $C_{add}$ in relation to scanning signal $V_i$.

Point defects produced in pixels in the character display portion of the liquid crystal display can be reduced. Also, nonuniformity of density of darkened portions can be decreased. Further, the possibility that one electrode of the retaining capacitive element included in the pixel electrode of each pixel breaks can be reduced. Additionally, the capacitance electrode line of the first or final stage can be connected with a common pixel electrode with a simple configuration. Furthermore, the DC cancel system can be adopted, and the DC component applied to the liquid crystal can be reduced further. Hence, the life of the liquid crystal can be increased.

What is claimed is:

1. A method for manufacturing a display device, in which a plurality of picture cells each including a pixel electrode, a capacitor and a field-effect transistor with a gate electrode and a pair of source-drain electrodes are arrayed in a matrix, comprising the steps of:
    (A) depositing a transparent and electrically conductive material to form a first layer over a transparent insulating substrate;
    (B) depositing an opaque and electrically conductive material to form a second layer over said first layer;
    (C) selectively removing said second layer according to a first pattern to leave portions thereof at which said gate electrode, said capacitor and said pixel electrode are to be formed;
    (D) selectively removing said first layer according to said first pattern;
    (E) depositing an insulating material to form a third layer over said second layer;

(F) depositing a semiconductor material to form a fourth layer over said third layer;

(G) according to a second pattern and third pattern, selectively removing a portion of said fourth and third layers at which said pixel electrode is to be formed and selectively removing a portion of said fourth layer at which said capacitor is to be formed;

(H) depositing an electrically conductive material to form a fifth layer over said fourth layer;

(I) selectively removing said fifth layer to leave portions acting as said source-drain electrodes and one of electrode of said capacitor and expose the portion of said second layer at said pixel electrode; and (J) selectively removing the exposed portion of said second layer to selectively expose said first layer.

2. The method as defined in claim 1, wherein, in said step (G), the further portion of said fourth and third layers at which one of said source-drain electrodes and said one of electrode of said capacitor are to contact with said pixel electrode.

3. The method as defined in claim 1, wherein, in said step (C), the portion of said second layer at which the interconnection wiring is to be formed is left.

4. The method as defined in claim 3, wherein said interconnection wiring is continuous with said gate electrode.

5. The method as defined in claim 1, wherein, in said step (I), the portion of said fifth layer acting as interconnection wiring is left.

6. The method as defined in claim 5, wherein said interconnection wiring is contiguous with said one of said source-drain electrodes.

7. The method according to claim 1, wherein said third layer is comprised of silicon nitride and said fourth layer is comprised of silicon.

8. The method according to claim 7, wherein said fourth layer is comprised of a first amorphous silicon layer and an impurity-rich-doped second amorphous silicon layer formed over said first amorphous silicon layer.

9. The method according to claim 8 further comprising the step of after said (I), further selectively removing said second silicon layer not covered with said fifth layer.

10. A method for manufacturing a display device comprising, in sequence, the steps of:

(A) forming a first-level layer of a transparent and conductive material;

(B) forming a second-level layer of an opaque and conductive material over said first-level layer;

(C) selectively removing said second-level layer and said first level-layer according to a first mask pattern;

(D) forming a third-level layer of an insulating material over said second-level layer;

(E) forming a fourth-level layer of a semiconductor material over said third-level layer;

(F) selectively removing said fourth-level layer and said third-level layer according to a second mask pattern;

(G) further selectively removing said fourth-level layer according to a third mask pattern; and (H) forming an electrically conductive material as a fifth-level layer over said fourth-level layer;

whereby just after the step (H) said fourth-level layer is left according to said third mask pattern, while said third-level layer is left according to said second mask pattern.

11. The method as defined in claim 10, further comprising the steps of:

(I) selectively removing said fifth-level layer according to a fourth mask pattern to expose a portion of said second-level layer not covered with said fourth-level layer or said third-level layer; and (J) selectively removing the exposed portion of said second-level layer to selectively expose said first-level layer.

12. A method for manufacturing a display device comprising, in sequence, the steps of:

(A) forming a first-level layer of a transparent and conductive material;

(B) forming a second-level layer of an opaque and conductive material over said first-level layer;

(C) selectively removing said second-level layer and said first level-layer according to a first mask pattern;

(D) forming a third-level layer of an insulating material over said second-level layer;

(E) forming a fourth-level layer of a semiconductor material over said third-level layer;

(F) selectively removing said fourth-level layer according to a second mask pattern to selectively expose said third-level layer;

(G) selectively removing the exposed portion of said third-level layer according to a third mask pattern; and (H) forming an electrically conductive material as a fifth-level layer over said fourth-level layer.

13. The method as defined as claim 12, further comprising the steps of:

(I) selectively removing said fifth-level layer according to a fourth mask pattern to expose a portion of said second-level layer not covered with said fourth-level layer or said third-level layer; and (J) selectively removing the exposed portion of said second-level layer to selectively exposed said first-level layer.

* * * * *